(12) United States Patent
Waidhas et al.

(10) Patent No.: US 11,764,187 B2
(45) Date of Patent: Sep. 19, 2023

(54) SEMICONDUCTOR PACKAGES, AND METHODS FOR FORMING SEMICONDUCTOR PACKAGES

(71) Applicant: Intel Corporation, Santa Clara, CA (US)

(72) Inventors: Bernd Waidhas, Pettendorf (DE);
Georg Seidemann, Landshut (DE);
Thomas Wagner, Regelsbach (DE);
Andreas Wolter, Regensburg (DE);
Andreas Augustin, Munich (DE);
Sonja Koller, Lappersdorf (DE);
Thomas Ort, Veitsbronn (DE);
Reinhard Mahnkopf, Oberhaching (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,241

(22) PCT Filed: Sep. 29, 2017

(86) PCT No.: PCT/US2017/054209
§ 371 (c)(1),
(2) Date: Feb. 23, 2020

(87) PCT Pub. No.: WO2019/066884
PCT Pub. Date: Apr. 4, 2019

(65) Prior Publication Data
US 2020/0227388 A1    Jul. 16, 2020

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/0651* (2013.01);
(Continued)

(58) Field of Classification Search
CPC ................. H01L 25/0657; H01L 25/50; H01L 2225/06506; H01L 2225/0651;
(Continued)

(56) References Cited

U.S. PATENT DOCUMENTS 6,093,969 A * 7/2000 Lin ......................... H01L 23/24
257/777
6,847,109 B2 * 1/2005 Shim ..................... H01L 25/105
257/697

(Continued)

OTHER PUBLICATIONS

Ultra Thin Copper Foil with Carrier Foil (Heat-Resistant Peelable Copper Foil) "F-HP" —Furukawa Review, No. 38, 2010.

*Primary Examiner* — Timor Karimy
(74) *Attorney, Agent, or Firm* — 2SPL Patent Attorneys PartG mbB; Kieran O'Leary

(57) ABSTRACT

A semiconductor package includes a first semiconductor die, a semiconductor device comprising a second semiconductor die, and one or more wire bond structures. The wire bond structure includes a bond interface portion. The wire bond structure is arranged next to the first semiconductor die. The first semiconductor die and the bond interface portion of the wire bond structure are arranged at the same side of the semiconductor device. An interface contact structure of the semiconductor device is electrically connected to the wire bond structure.

14 Claims, 29 Drawing Sheets

(52) U.S. Cl.
CPC ............... *H01L 2225/06506* (2013.01); *H01L 2225/06517* (2013.01); *H01L 2225/06562* (2013.01); *H01L 2225/06586* (2013.01)

(58) Field of Classification Search
CPC . H01L 2225/06517; H01L 2225/06562; H01L 2225/06586; H10B 80/00
See application file for complete search history.

(56) References Cited

U.S. PATENT DOCUMENTS

| | | | | |
|---|---|---|---|---|
| 8,125,076 | B2* | 2/2012 | Kim | H01L 23/36 257/707 |
| 9,214,431 | B1* | 12/2015 | Terrovitis | H01L 23/552 |
| 2004/0178512 | A1 | 9/2004 | Moden et al. | |
| 2013/0307141 | A1 | 11/2013 | Odegard et al. | |
| 2016/0322326 | A1* | 11/2016 | Katkar | H01L 24/49 |
| 2016/0379747 | A1 | 12/2016 | Wolter et al. | |
| 2017/0069532 | A1 | 3/2017 | Lee et al. | |
| 2017/0117260 | A1* | 4/2017 | Prabhu | H01L 23/3128 |

\* cited by examiner

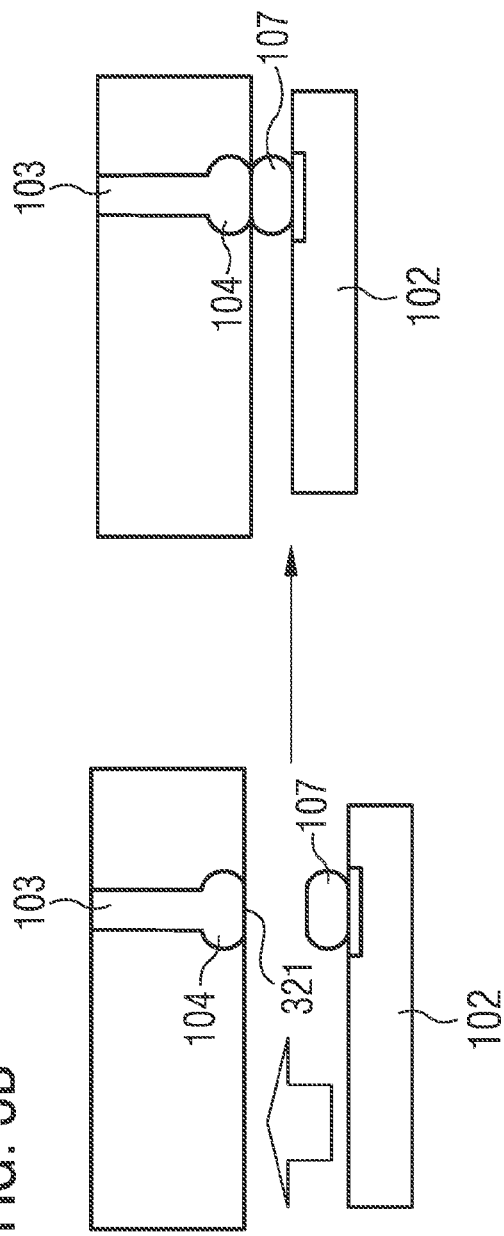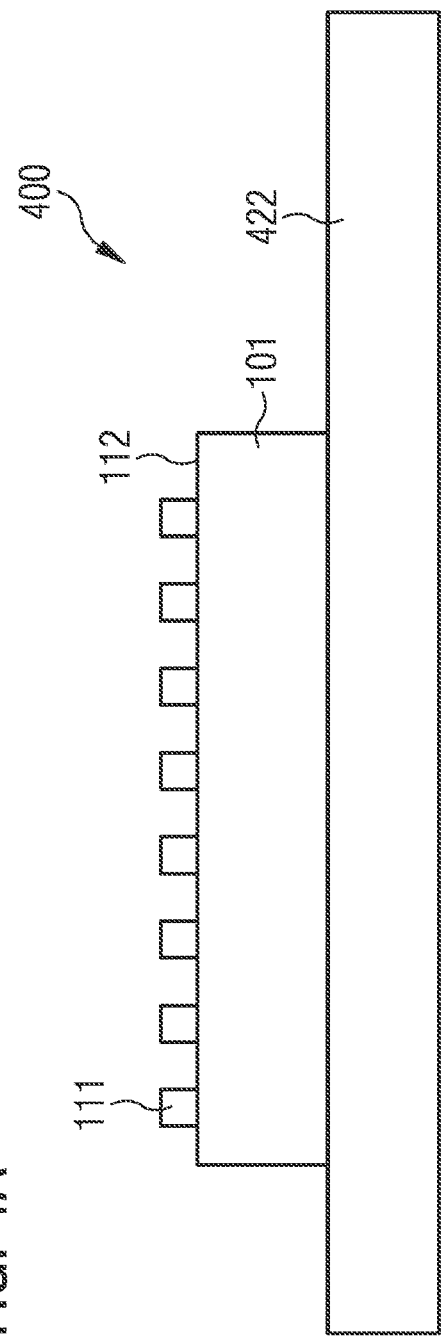

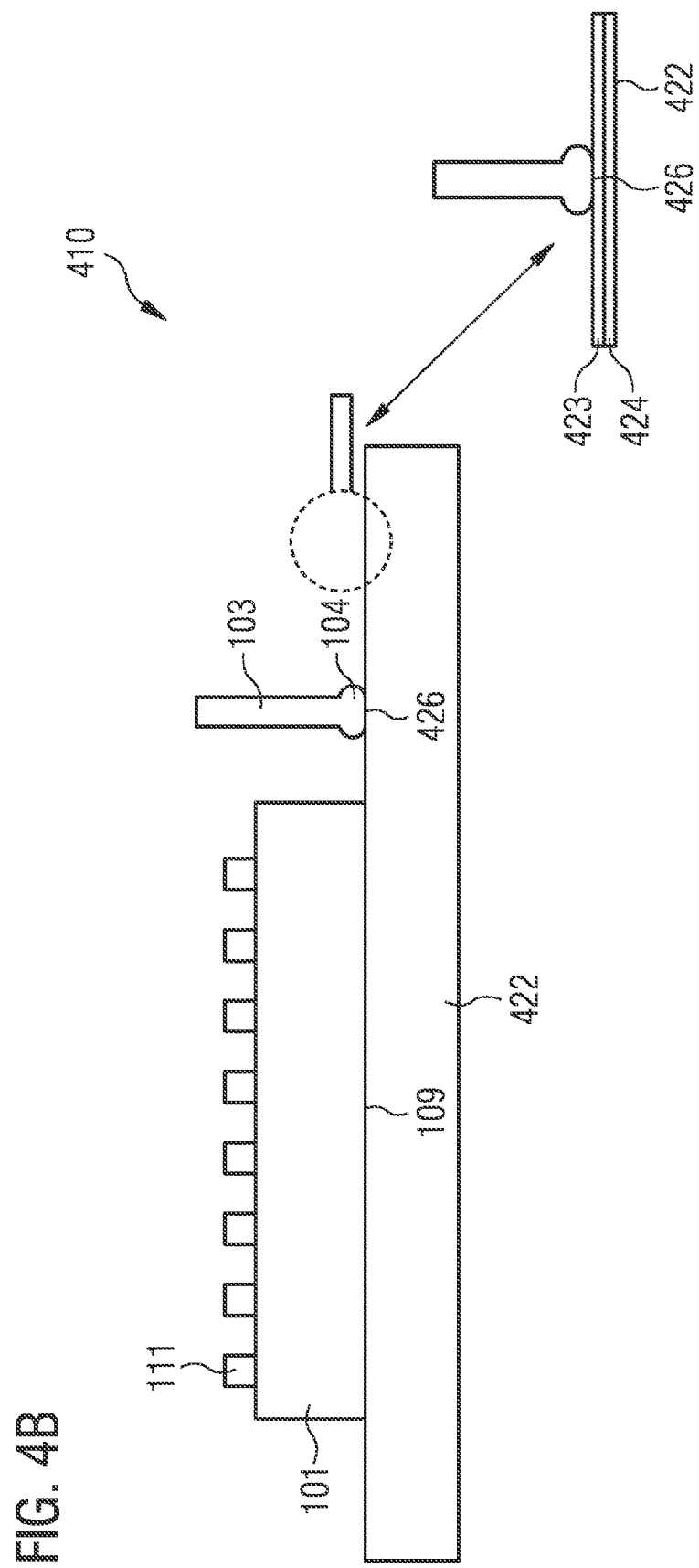

SEMICONDUCTOR PACKAGES, AND METHODS FOR FORMING SEMICONDUCTOR PACKAGES

TECHNICAL FIELD

Examples relate to concepts for providing interconnects in semiconductor packages, and/or for increasing the number of interconnects within a semiconductor package.

BACKGROUND

In order to realize small and thin devices (e.g. handheld devices) with higher integration schemes, semiconductor devices or semiconductor packages with a higher amount of connections (e.g. vertical connections) and different connection possibilities may be needed. Some semiconductor arrangements, such as hybrid stacking arrangements and lead frame arrangements may rely on wire bonding processes that do not efficiently utilize space within a semiconductor package. In these semiconductor packages, the number of connections which may be made within the semiconductor package may be limited.

BRIEF DESCRIPTION OF THE FIGURES

Some examples of apparatuses and/or methods will be described in the following by way of example only, and with reference to the accompanying figures, in which

FIG. 3B shows at least part of a method for forming a semiconductor package;

FIGS. 4A to 4L show schematic side view illustrations of a method for forming a semiconductor package;

DETAILED DESCRIPTION

Figure 1A:
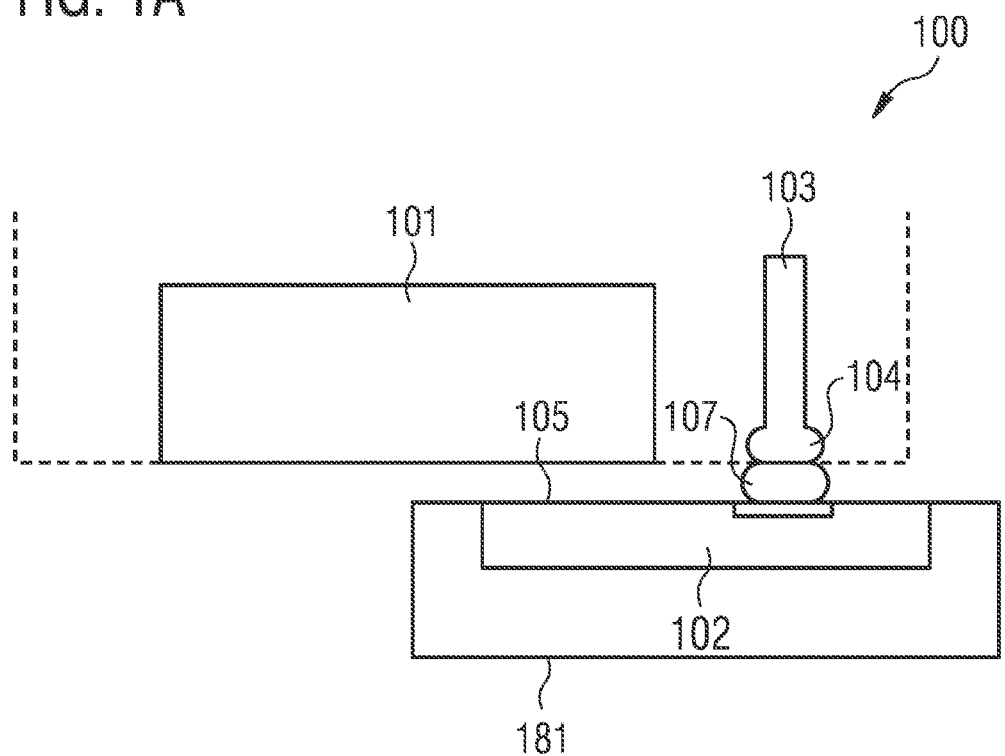
FIG. 1A shows a schematic illustration of a side view of a semiconductor package.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

FIG. 1A shows a schematic illustration of a cross-sectional side view of a semiconductor package 100.

The semiconductor package 100 comprises a first semiconductor die 101, a semiconductor device 181 comprising a second semiconductor die 102, and one or more wire bond structures 103. The wire bond structure 103 comprises a bond interface portion 104. The wire bond structure 103 is arranged next to the first semiconductor die 101. The first semiconductor die 101 and the bond interface portion 104 of the wire bond structure 103 are arranged at the same side 105 of the semiconductor device 181. An interface contact structure 107 of the semiconductor device 181 is electrically connected to the wire bond structure 103.

Due to the first semiconductor die 101 and the bond interface portion 104 of the wire bond structure 103 being arranged at the same side 105 of the semiconductor device 181, a semiconductor package with a higher number of vertical connections and more connection options may be achieved, for example.

A (or each) wire bond structure 103 of the one or more wire bond structures 103 may include a bond interface portion 104. The bond interface portion 104 of the wire bond structure 103 may include (or may be) a nail-head structure or a ball structure. The nail-head portion may also be referred to as a ball bond portion, for example. The nail head (or ball bond) portion may be an enlarged spherical portion of the wire bond structure 103. For example, the nail head (or ball bond) portion may have a larger lateral cross sectional area than a wire portion of the wire bond structure.

The wire bond structure 103 may be arranged so that the bond interface portion 104 is located at a level of a back side (e.g. a second side) of the first semiconductor die 101. For example, a lateral surface of the bond interface portion 104 may be located at a level of (e.g. at the same vertical level as) the back side (e.g. a back lateral side or surface) (shown as 109 in FIG. 1B) of the first semiconductor die 101. The wire bond structure 103 may further include a wire portion extending from the bond interface portion 104 towards one or more layers arranged at (or on) a front side (e.g. a first side) (shown as 112 in FIG. 1B) of the first semiconductor die 101. For example, the wire portion of the wire bond structure 103 may extend from the bond interface portion 104 towards a first (or front) side of the semiconductor package 100. Other than the surface of the bond interface portion 104, the rest of the wire bond structure 103 may be surrounded by a mold compound structure.

The semiconductor device 181 including the second semiconductor die 102 may optionally be a flip chip semiconductor package. For example, the semiconductor device 181 may be a semiconductor package 181, including the second semiconductor die 102 already encapsulated with mold encapsulation material, and interface contact structures 107 (e.g. solder structures). The semiconductor package 100 may thus be a package-on-package (POP) package. Alternatively or optionally, the semiconductor device 181 may be (or may refer to) the bare semiconductor die 102. Thus, the semiconductor package 100 may be a system in package (SIP) package.

The interface contact structure 107 of the semiconductor device 181 may include a solder structure (e.g. a solder ball, or e.g. a solder bump) which may be connected to a die pad structure of the second semiconductor die 102. The second semiconductor die 102 may be arranged with respect to the first semiconductor die 101, so that a back side of the first semiconductor die 101 may face a front side (e.g. a first side) of the semiconductor device 181. The first semiconductor die 101 and the bond interface portion 104 of the wire bond structure 103 may thus be arranged at the same side 105 (e.g. the front side) of the semiconductor device 181. The interface contact structure 107 of the second semiconductor die 102 may be one interface contact structure 107 of a plurality of interface contact structures arranged at the front side 105 of the semiconductor device 181. The front side 105 of the semiconductor device 181 may be the side of the semiconductor device 181 at which solder balls (or solder bumps) are arranged, for example.

The wire bond structure 103 may be arranged next to (e.g. laterally adjacent to) the first semiconductor die 101. At least part of the mold compound structure may be arranged laterally between the wire bond structure 103 and the first semiconductor die 101. The wire bond structure 103 may be (but is not limited to being) a gold wire bond structure 103, a copper wire bond structure 103, a silver wire bond structure 103, or a wire bond structure 103 comprising a mixture or an alloy of any of the following materials: copper, silver and gold (or other suitable material).

In the case of the semiconductor device 181 being a bare semiconductor die 102, the semiconductor package 100 may further include an adhesive underfill material arranged between the first semiconductor die 101 and the second semiconductor die 102. The underfill material may adhere (e.g. attach) at least part of the second semiconductor die 102 to the back side of the first semiconductor die 101 or to a back side layer (e.g. a back side redistribution layer) formed on (or at) the back side of the first semiconductor die 101. For example, the underfill material may adhere (directly or indirectly) a front side of the second semiconductor die 102 to the back side of the first semiconductor die 101. Additionally or optionally, the underfill material may adhere at least part of the second semiconductor die 102 to the mold compound structure. At least part of the underfill material may be arranged between a plurality of interface contact structures 107 (e.g. solder balls, or e.g. solder bumps) arranged at a front side 105 of the second semiconductor die 102. For example, at least part of the underfill material may fill gaps between the interface contact structures 107 of the plurality of interface contact structures 107.

In the case of the semiconductor device 181 being a semiconductor package (including mold encapsulation material, the adhesive underfill material may be arranged between a first semiconductor device package (which includes the first semiconductor die 101) and the second semiconductor device package (which includes the second semiconductor die 102). For example, the adhesive underfill material may be arranged between the two packages (e.g. between a top POP and a bottom package).

The interface contact structure 107 of the semiconductor device 181 may be soldered to the bond interface portion 104 of the wire bond structure 103. Thus, the interface contact structure 107 of the semiconductor device 181 may be electrically connected to the wire bond structure 103.

Optionally, or alternatively, the semiconductor package 100 may further include at least one back side redistribution layer arranged at the back side (shown as 109 in FIG. 1B) of the first semiconductor die 101. Alternatively, instead of the interface contact structure 107 of the second semiconductor die 102 being (directly) soldered to the bond interface portion 104 of the wire bond structure 103, the interface contact structure 107 of the semiconductor device 181 may be electrically connected to the bond interface portion 104 of the wire bond structure 103 via (or through) the at least one back side redistribution layer.

The semiconductor package 100 may include a plurality of interconnect structures extending from the front side of the first semiconductor die 101 towards a plurality of interface solder structures (e.g. solder balls) arranged at the first side of the semiconductor package 100. The first side of the semiconductor package 100 may be a side of the semiconductor package at (or facing, or closest to, or adjacent to) the front side of the first semiconductor die 101, for example. The plurality of interface solder structures may be configured to provide a connection to a carrier structure. The carrier structure may be an interposer carrier structure or a printed circuit board.

A (or each) interconnect structure may include a die pad portion arranged at the front side of the first semiconductor die 101. Additionally or optionally, each (or a) interconnect structure may further include a via portion (e.g. a copper stud portion) extending (vertically) through the mold compound structure from the die pad portion of the interconnect structure to the first side of the semiconductor package 100. The plurality of interconnect structures may be electrically connected to the plurality of interface solder structures via a front side redistribution layer arranged at the front side of the first semiconductor die 101.

Each wire bond structure 103 of the one or more wire bond structures 103 may have its own geometry. For example, the semiconductor package 100 may include at least one wire bond structure 103, which may extend from the interface contact structure 107 of the semiconductor device 181 directly towards a first side of the semiconductor package 100. The wire portion of the wire bond structure 103 may extend (substantially vertically) from the bond interface portion 104 of the wire bond structure towards the first side of the semiconductor package 100 where the wire portion terminates, for example. Optionally, the wire bond structure 103 may extend from the interface contact structure 107 of the semiconductor device 181 to a front side redistribution layer arranged at the front side of the first semiconductor die 101.

Figure 2A:
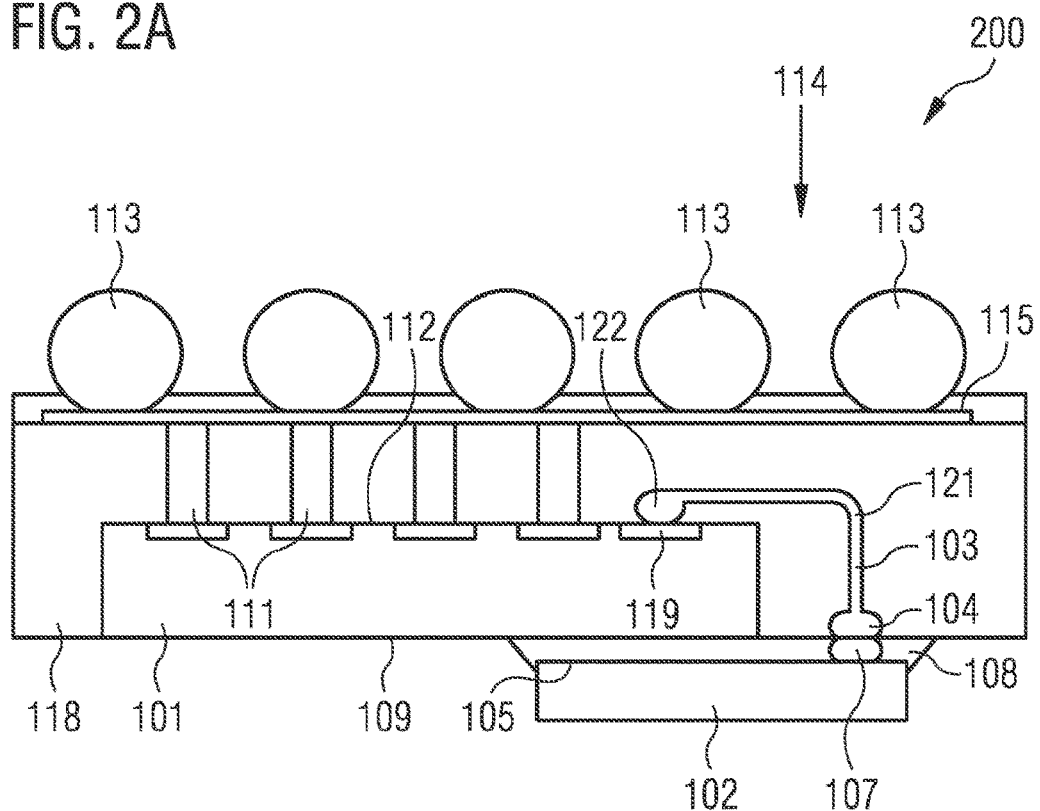
FIGS. 2A to 2C show schematic side view illustrations of semiconductor packages with various wire bond structures.
Figure 2B:
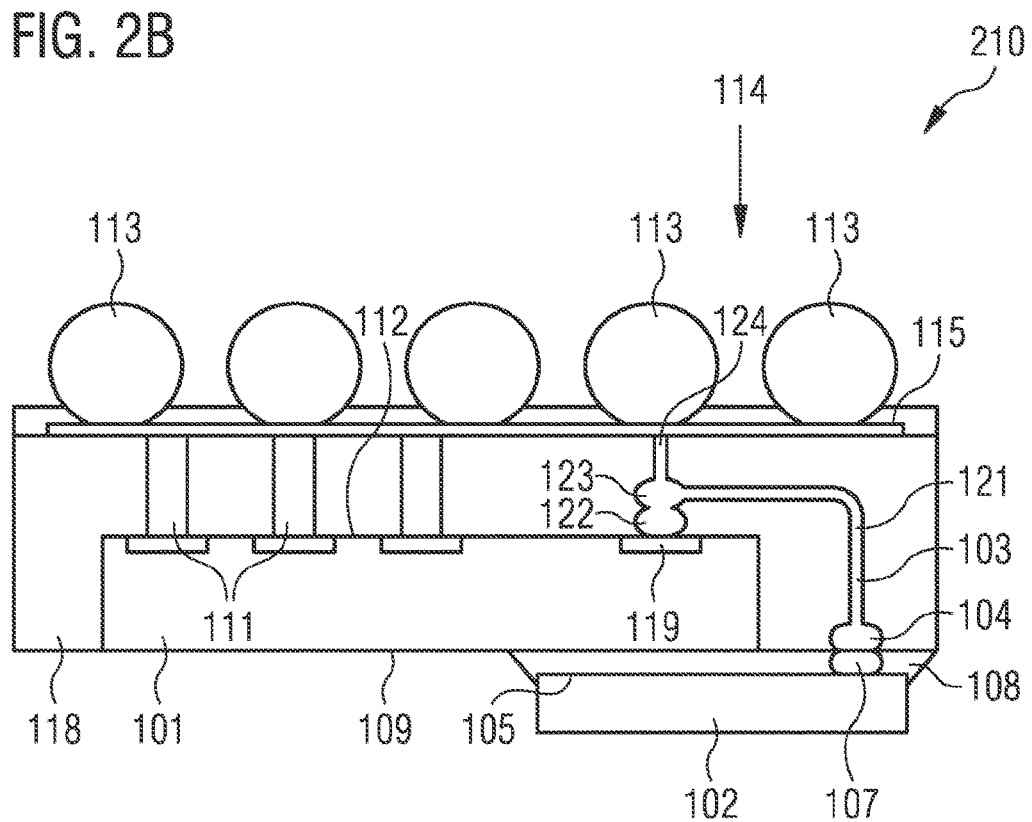
Figure 2C:
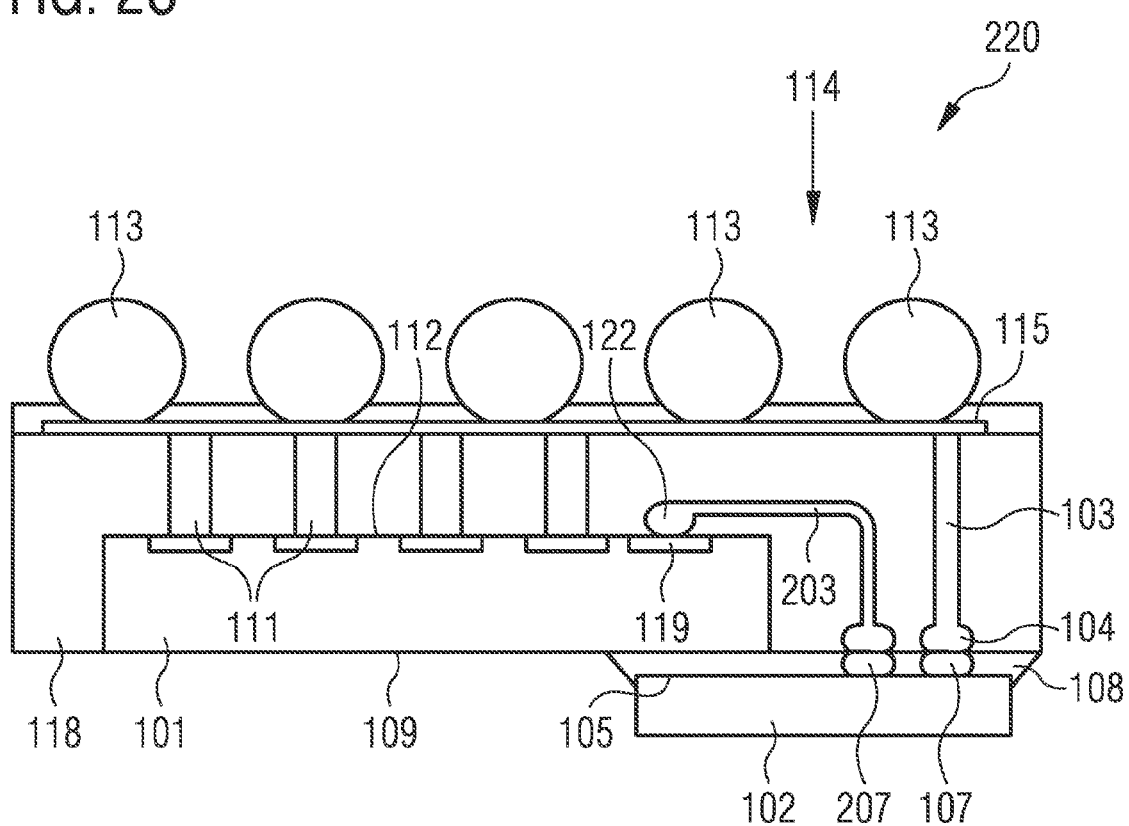

Alternatively, additionally or optionally, the semiconductor package 100 may include at least one wire bond structure 103, which may extend from the interface contact structure 107 of the semiconductor device 181 to a die pad structure arranged at the front side of the first semiconductor die 101 (e.g. a loop wire bond structure) as shown in FIGS. 2A to 2C. The loop wire bond structure 103 may optionally include a second bond interface portion attached (e.g. soldered) to the die pad structure of the first semiconductor die 101. The second bond interface portion of the wire bond structure may include a nail-head structure or a wedge structure, for example.

Alternatively, additionally or optionally, the semiconductor package 100 may include at least one wire bond structure 103, which may extend from the interface contact structure 107 of the semiconductor device 181 to the front side redistribution layer via the die pad structure arranged at a front side of the first semiconductor die 101. For example, the wire bond structure 103 may include a first bond interface portion 104 electrically connected to the interface contact structure 107 of the semiconductor device 181. The wire bond structure 103 may include a first wire portion (e.g. a loop wire portion) extending from the first bond interface portion 104 to a second bond interface portion of the wire bond structure 103. The second bond interface portion of the wire bond structure 103 may be attached to a die pad structure (e.g. soldered to form an Au—Al bond) arranged at the front side of the first semiconductor die 101. The wire bond structure 103 may further include a third bond interface portion attached to the second bond interface portion of the wire bond structure 103. The wire bond structure 103 may further include a second wire portion (e.g. a vertical wire portion) extending from the third bond interface portion and ending at a layer (e.g. a front side redistribution layer) arranged at the first side of the semiconductor package 100. The second bond interface portion of the wire bond structure 103 may be soldered to the third bond interface portion of the wire bond structure 103. For example, the second bond interface portion of the wire bond structure 103 and the third bond interface portion of the wire bond structure 103 may be connected (or joined, or soldered together) via a nail-head on nail-head bond.

The semiconductor package 100 may include any combination of the described wire bond structures 103. For example, the semiconductor package 100 may include a first wire bond structure 103 (e.g. a direct wire bond structure) extending from the interface contact structure 107 of the semiconductor device 181 and ending at the front side redistribution layer arranged at a front side of the first semiconductor die 101. The first wire bond structure may be a vertical wire bond structure extending directly from the interface contact structure 107 of the semiconductor device 181 to the front side redistribution layer. The semiconductor package 100 may further include a second wire bond structure (e.g. a loop wire bond structure) extending from the interface contact structure 107 of the semiconductor device 181 and ending (e.g. with a nail-head bond or a wedge bond) at (or on, or e.g. directly on) a die pad structure arranged at the front side of the first semiconductor die 101. Alternatively, instead of the second wire bond structure ending at the die pad structure, the second wire bond structure may extend from the interface contact structure 107 of the semiconductor device 181 to the front side redistribution layer via the die pad structure arranged at a front side of the first semiconductor die 101.

The semiconductor package 100 may further include other wire bond structures. For example, the semiconductor package 100 may include a lateral wire bond structure (e.g. a die pad to die pad wire bond structure) extending from the first die pad structure arranged at the front side of the first semiconductor die 101 to a second die pad structure arranged at the front side of the first semiconductor die 101. Optionally, the lateral wire bond structure may extend from the second bond interface portion of the wire bond structure 103 to a second die pad structure arranged at the front side of the first semiconductor die. The second bond interface portion of the wire bond structure 103 may be soldered to a bond interface portion (e.g. a nail-head bond) of the lateral wire bond structure, for example. For example, the wire bond structure 103 and the lateral wire bond structure may be joined via a nail-head on nail-head bond.

Additionally or optionally, the semiconductor package 100 may include a further semiconductor die arranged laterally adjacent to the first semiconductor die 101. A lateral wire bond interconnect structure may connect a die pad structure of the first semiconductor die 101 to a die pad structure of the further semiconductor die. A first end of the wire bond interconnect structure and the die pad structure of the first semiconductor die may be joined via a wedge bond. Additionally or optionally, a second end of the wire bond interconnect structure and the die pad structure of the further semiconductor die may be joined via a wedge bond.

In the examples described herein, a lateral surface of the semiconductor die may be a substantially even plane (e.g. neglecting unevenness of the semiconductor structure due to the manufacturing process and trenches). For example, a minimal lateral length of the semiconductor die, or a minimal dimension of the lateral surface of the semiconductor die may be more than 10 times larger than a maximal height of structures on the main surface. Additionally, a minimal lateral dimension of the lateral surface of the semiconductor die may be more than 10 times larger than a basically vertical dimension (or height) of a vertical edge of the semiconductor die. For example, a die side length may be larger than 1 mm, and a die thickness may be between 50 μm and 500 μm. The vertical edges of the semiconductor die may be the edges resulting from individualizing or dicing the semiconductor die. The lateral surface may be substantially perpendicular (or orthogonal) to the vertical edges of the semiconductor die (ignoring manufacturing tolerances). For example, in comparison to a (substantially vertical or orthogonal) edge of the semiconductor die, the lateral surface may be a basically horizontal surface extending laterally.

A lateral dimension, lateral distance or lateral length of the semiconductor die may be a dimension or distance measured in a direction substantially horizontal to (and/or parallel to) the lateral surface of the semiconductor die. Additionally, a lateral direction may be a direction substantially horizontal to (and/or parallel to) the lateral surface of the semiconductor die. A vertical dimension, vertical distance or vertical length of the semiconductor die may be a dimension or distance measured in a direction substantially perpendicular to the lateral surface of the semiconductor die.

A front side of the semiconductor die may be a side or surface of the semiconductor substrate die towards metal layers, insulation layers and/or passivation layers on top of the semiconductor substrate die or a surface of one of these layers. For example, a semiconductor substrate die front side may be the side at which active elements of the chip are formed. For example, in a semiconductor die of some power semiconductor devices, a chip (or semiconductor substrate) front side may be a side of the chip at which a first source/drain region and a gate region are formed, and a chip (or semiconductor substrate) back side may be a side of the chip at which a second source/drain region is formed. For example, more complex structures may be arranged at the chip front side than at the chip back side.

The various examples described herein may relate to realizing small and thin (handheld) devices with higher integration. The examples may provide a higher number of vertical connections and different connection options. Besides connecting wire bonds to semiconductor dies via pads (e.g. die pads), the examples further relate to using a nail-head at the bond ball side to generate new connection options (e.g. direct wire attach to a solder ball, a solder bump, a copper pillar and/or an additional nail head via soldering).

The various examples may include generating a wire bond nail-head structure (e.g. a Au structure, a Cu structure and/or a Ag structure) and using the nail-head structure for new connections to be formed later in process. The bond ball (e.g. the nail head structure) may be used to connect to solder balls, solder bumps or copper pillars, for example. Additionally or optionally, semicircular connections may be realized, for example.

The first semiconductor die 101 may include at least one circuit selected from the following group of circuits: a logic circuit, a transistor circuit, a processor circuit. The circuit may include (or may be) power transistor structures (e.g. power metal oxide semiconductor field effect transistor (MOSFET) structures, e.g. power insulated gate bipolar transistor (IGBT) structures, and/or e.g. double-diffused metal oxide semiconductor (DMOS) transistor structures) and/or power diode structures, for example. The operating voltage (e.g. breakdown voltage and/or e.g. blocking voltage) of a power circuit structure may be more than 10V (or e.g. more than 100 V, or e.g. more than 500 V), for example. Thus, the semiconductor die 101 may, optionally, be a power semiconductor die 101 having a breakdown voltage or blocking voltage of more than 10V (or e.g. more than 100 V, or e.g. more than 500 V), for example.

The second semiconductor die 102 attached at the back side of the first semiconductor die 101 may include at least one circuit selected from the following group of circuits: a memory circuit, an antenna circuit, a sensor circuit, an integrated passive components circuit and a transceiver circuit. Alternatively or optionally, the second semiconductor die 102 may be a second logic die.

Figure 1B:
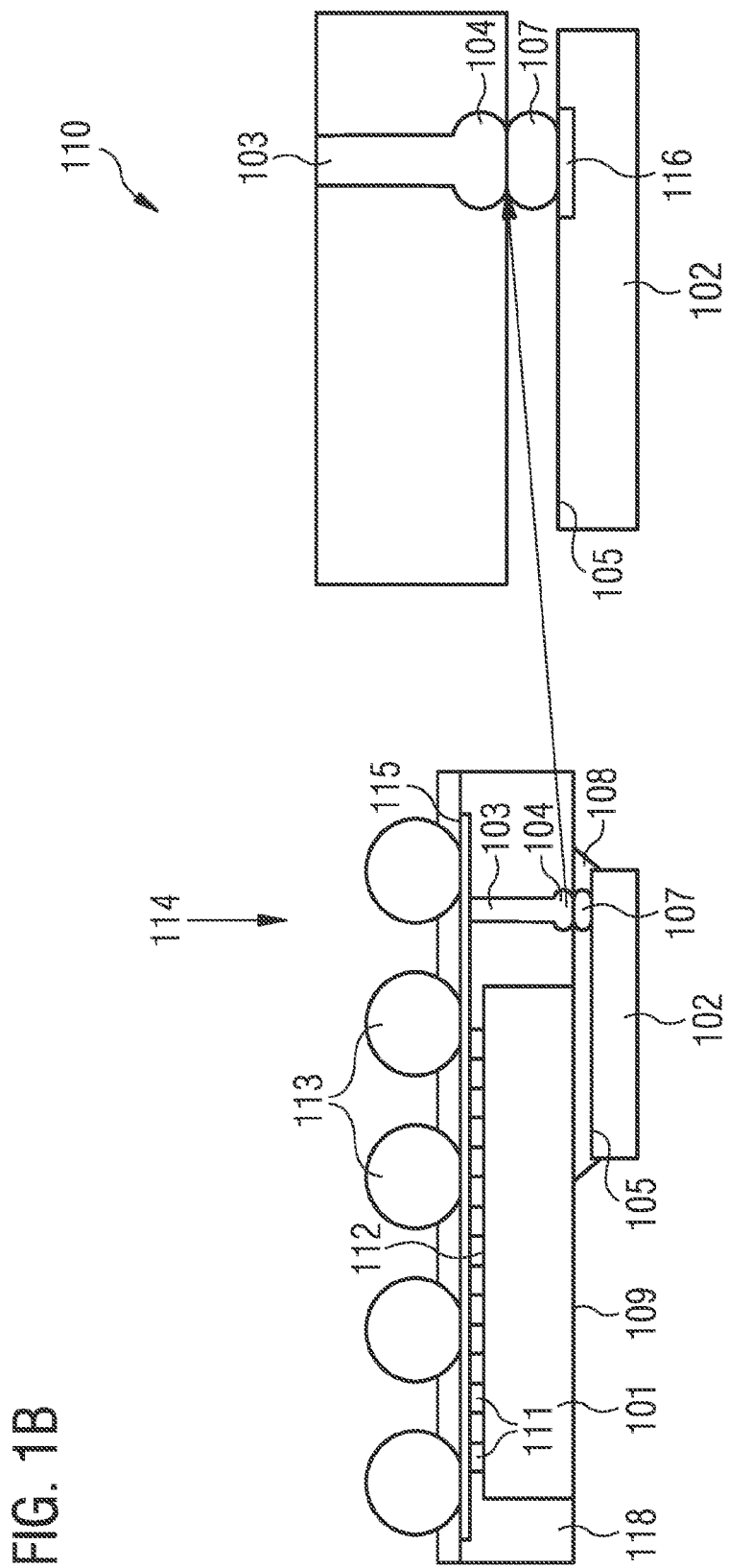
FIG. 1B shows a schematic illustration of a side view of a further semiconductor package having a plurality of interface solder structures.

FIG. 1B shows a schematic illustration of a cross-sectional side view of a semiconductor package 110. FIG. 1B shows an example of the semiconductor device including (or being) the bare semiconductor die 102. For example, FIG. 1B shows a vertically connected semiconductor die 102, connected via a nail head structure 104 (e.g. an Au nail head) and a solder ball 107.

The semiconductor package 110 may be similar to the semiconductor package 100 described in connection with FIG. 1A. For example, the semiconductor package 110 may include one or more or all of the features already described with respect to semiconductor package 100. For example, FIG. 1B shows the first semiconductor die 101 and the bond interface portion 104 of the wire bond structure 103 arranged at the same side 105 of the second semiconductor die 102, and an interface contact structure 107 of the second semiconductor die 102 electrically connected to the wire bond structure 103.

The semiconductor package 110 may further include the adhesive underfill material 108 arranged between the first semiconductor die 101 (e.g. a Si die) and the second semiconductor die 102 (e.g. Si memory die). The underfill material 108 may be arranged at the front side 105 of the second semiconductor die 102, and may adhere at least part of the front side of the second semiconductor die 102 to the back side 109 of the first semiconductor die 101.

The semiconductor package 110 may further include a plurality of interconnect structures 111 extending from the front side 112 of the first semiconductor die 101 towards a plurality of interface solder structures 113 (e.g. solder balls) arranged at the first side 114 of the semiconductor package 100. The plurality of interconnect structures 111 may be electrically connected to the plurality of interface solder structures 113 via the front side redistribution layer (RDL) 115 arranged at the front side 114 of the first semiconductor die 101.

The interface contact structure 107 of the second semiconductor die 102 may include (or may be) a solder structure (e.g. a solder ball) which may be connected to the die pad structure 116 arranged at the front side 105 of the second semiconductor die 102.

The mold compound structure 118 may surround the wire bond structure 103 and the first semiconductor die 101. For example, the mold compound structure 118 may encapsulate the first semiconductor die 101 and the wire bond structure 103 except at the back side 109 of the first semiconductor die 101. Additionally, other than the surface of the bond interface portion 104 for attaching to the interface contact structure 107 of the second semiconductor die 102, the rest of the wire bond structure 103 may be surrounded by the mold compound structure 118.

FIG. 2A shows a schematic illustration of a cross-sectional side view of a semiconductor package 200. The semiconductor package 200 may be similar to the semiconductor package 110 described in connection with FIG. 1A. In FIG. 2A, the semiconductor device may be a bare semiconductor die 102. For example, FIG. 2A shows a vertically connected semiconductor die 102 (e.g. a memory die), connected via a nail head structure 104 (e.g. an Au nail head) and a solder ball 107. The nail head structure 104 may be part of the loop wire bond structure 103.

The semiconductor package 200 may include at least one wire bond structure 103 which may be a loop wire bond structure. For example, the loop wire bond structure 103 may extend from the interface contact structure 107 of the second semiconductor die 102 and end at (or on, or e.g. directly on) a die pad structure 119 arranged at (or on) the front side 112 of the first semiconductor die 101. The wire bond structure 103 may include a first wire portion 121 extending from the first bond interface portion 104 to a second bond interface portion 122 of the wire bond structure 103. The second bond interface portion 122 of the wire bond structure 103 may include a nail-head structure or a wedge structure, for example. The second bond interface portion 122 may be attached (e.g. soldered) to the die pad structure 119 of the first semiconductor die 101.

FIG. 2B shows a schematic illustration of a cross-sectional side view of a semiconductor package 210. The semiconductor package 210 may be similar to the semiconductor package 200 described in connection with FIG. 2A. For example, FIG. 2B shows a vertically connected semiconductor die 102 (e.g. a memory die), connected via the nail head structure 104 (e.g. an Au nail head) and the solder ball 107.

The semiconductor package 210 may include at least one wire bond structure 103 which may be a loop-direct wire bond structure 103. The wire bond structure 103 which may provide a loop connection from the memory die 102 to the silicon die 101, and a direct wire connection from the silicon die 101 to the front side redistribution layer 115 using a nail-head on nail-head bond, for example.

The wire bond structure 103 may include a first bond interface portion 104 electrically connected to the interface contact structure 107 of the second semiconductor die 102. The wire bond structure 103 may include a first wire portion (e.g. a loop wire portion) extending from the first bond interface portion 104 to a second bond interface portion of the wire bond structure 103. The second bond interface portion of the wire bond structure 103 may be attached to a die pad structure (e.g. soldered to form an Au—Al bond) arranged at the front side of the first semiconductor die 101. The wire bond structure 103 may further include a third bond interface portion 123 attached to the second bond interface portion 122 of the wire bond structure 103. The wire bond structure 103 may further include a second wire portion 124 (e.g. a direct wire portion) extending from the third bond interface portion 123 and to (and/or e.g. ending at) the front side redistribution layer 115 arranged at a front side of the first semiconductor die 101 (e.g. at the first side of the semiconductor package 210). The second bond interface portion 122 of the wire bond structure 103 may be soldered to the third bond interface portion 123 of the wire bond structure 103. For example, the second bond interface portion 122 of the wire bond structure 103 and the third bond interface portion 123 of the wire bond structure 103 may be connected (or joined, or soldered together) via a nail-head on nail-head bond.

FIG. 2C shows a schematic illustration of a cross-sectional side view of a semiconductor package 220. The semiconductor package 220 may be similar to the semiconductor package 210 described in connection with FIG. 2B. For example, FIG. 2C shows a vertically connected semiconductor die 102 (e.g. a memory die), connected via a nail head structure 104 (e.g. an Au nail head) and a solder ball 107.

The semiconductor package 220 may include a direct wire bond structure 103 and a loop wire bond structure 203. The semiconductor package 220 may include a first wire bond structure 103 (e.g. the direct wire bond structure 103) extending from the interface contact structure 107 of the second semiconductor die 102 and ending at the front side redistribution layer 115 arranged at the front side of the first semiconductor die 101. The first wire bond structure 103 may be a vertical wire bond structure extending directly from a first interface contact structure 107 of the second semiconductor die 102 to the front side redistribution layer 115. The semiconductor package 100 may further include a second wire bond structure 203 (e.g. the loop wire bond structure) extending from a second interface contact structure 207 of the second semiconductor die 102 and ending (e.g. with a nail-head bond or a wedge bond) at (or on, or e.g. directly on) a die pad structure 119 arranged at the front side 112 of the first semiconductor die 101.

Figure 2D:
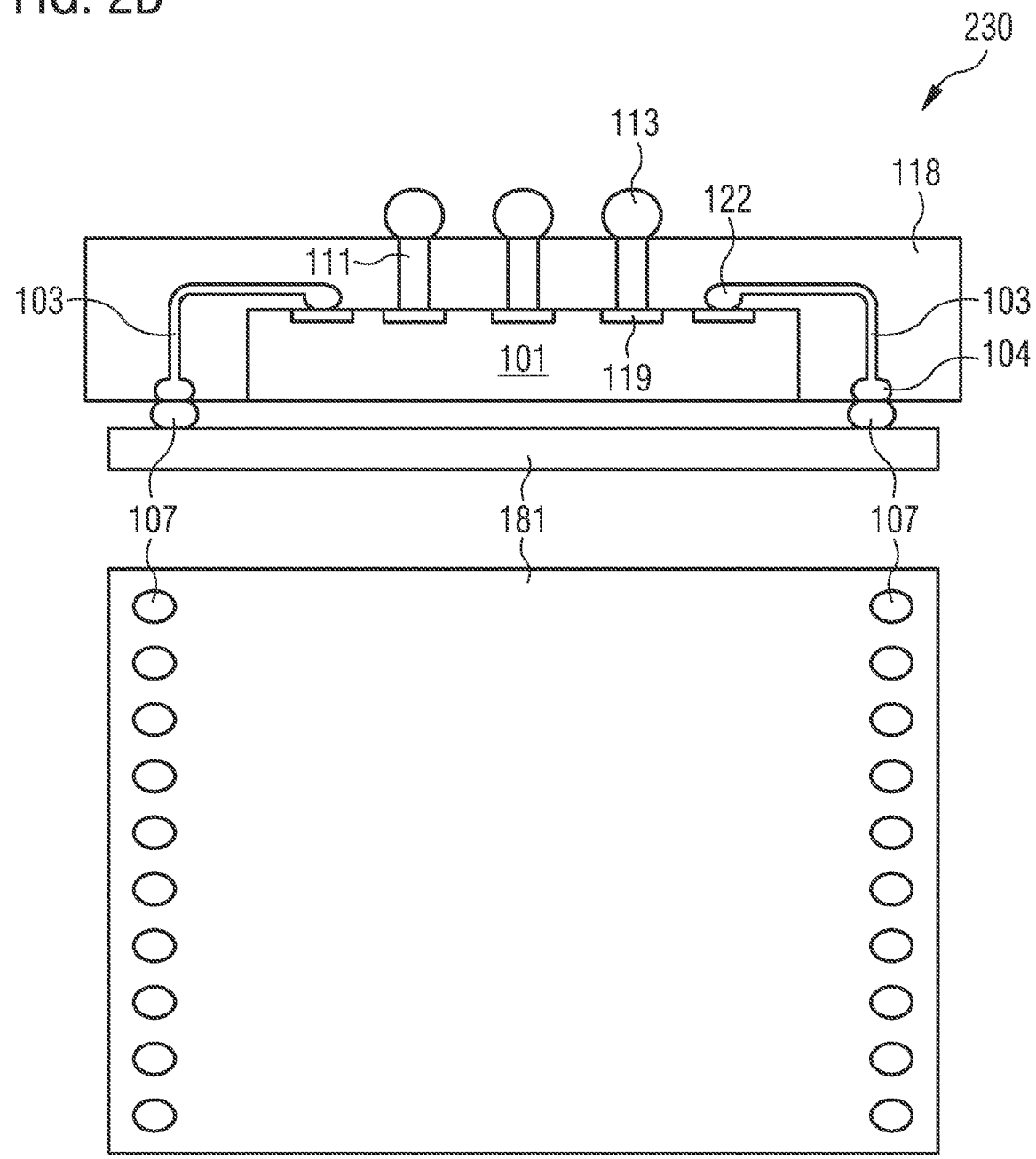
FIG. 2D shows a schematic side view illustration of a package on package (POP) semiconductor package.

FIG. 2D shows a schematic illustration of a cross-sectional side view of a semiconductor package 230. The semiconductor package 230 may be similar to the semiconductor package 220 described in connection with FIG. 2C. In FIG. 2D, the semiconductor device 181 may be a semiconductor package comprising a second semiconductor die. Thus, the semiconductor package 230 may be a package on package (POP) semiconductor package.

The first semiconductor die 101 may be part of a first (bottom and stand-alone) semiconductor package including a first mold encapsulation structure 118 encapsulating the first semiconductor die 101 and the one or more wire bond structures 103.

The second semiconductor die 102 may be part of the second semiconductor package 181 (e.g. a wafer level chip scale package). The semiconductor device 181 may be semiconductor package that is assembled in a separate process as a PoP package before attaching the semiconductor device 181 to the first wire bond structure 103. The interface contact structures 107 of the semiconductor device 181 may be solder balls of a ball grid array of a semiconductor package, for example. The semiconductor device 181 may be attached to one or more wire bond structures 103 by making use of the contact areas formed by the wire bond structures 103. For example, the plurality of interface contact structures 107 of the semiconductor device 181 may be attached to (e.g. soldered) to the bond interface portions 104 of the wire bond structures 103 of the first semiconductor package comprising the first semiconductor package.

Figure 2E:
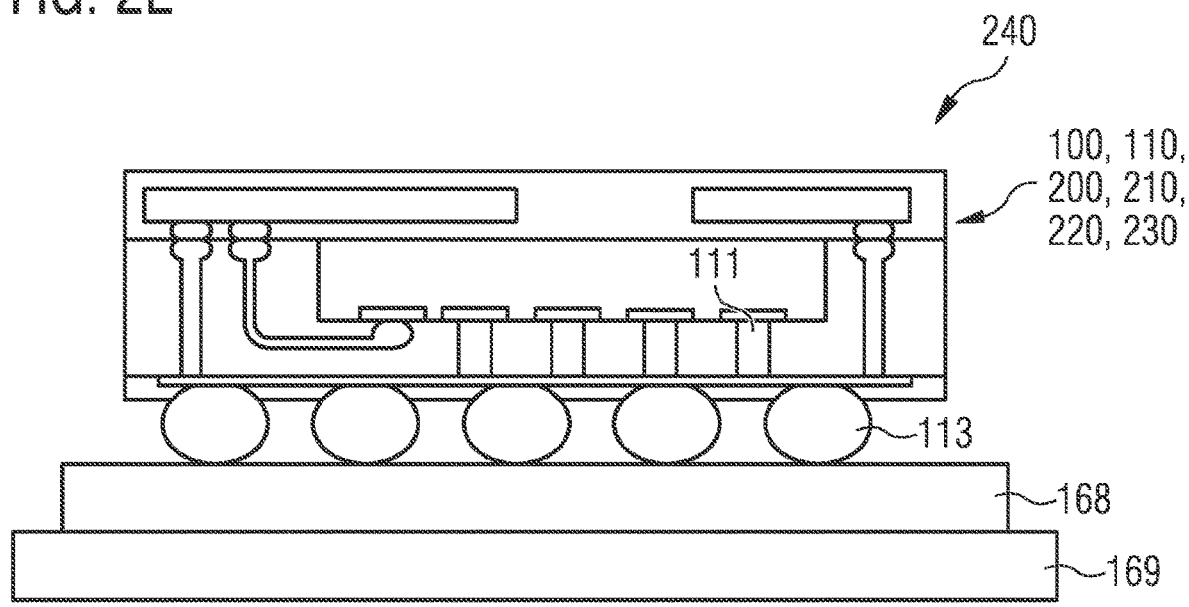
FIG. 2E shows a schematic side view illustration of a system level semiconductor package arrangement.

FIG. 2E shows a schematic illustration of a semiconductor package arrangement 240. The schematic illustration shows a system level arrangement including a semiconductor package described according to the examples herein.

The semiconductor package 100, 110, 200, 210, 220, 230 may include a plurality of interconnect structures 111 extending from the front side of the first semiconductor die 101 towards a plurality of interface solder structures (e.g. solder balls) 113 arranged at the first side of the semiconductor package. The plurality of interface solder structures 113 may be configured to provide a connection to a carrier structure 168 (e.g. an interposer carrier structure or a printed circuit board). The carrier structure 168 may further be connected (e.g. screwed) to a housing structure 169.

More details and aspects are mentioned in connection with the examples described above or below. The examples shown in FIGS. 2A to 2E may each comprise one or more optional additional features corresponding to one or more aspects mentioned in connection with the proposed concept or one or more examples described above (e.g. FIGS. 1A to 1B) or below (FIGS. 3A to 15).

Figure 3A:
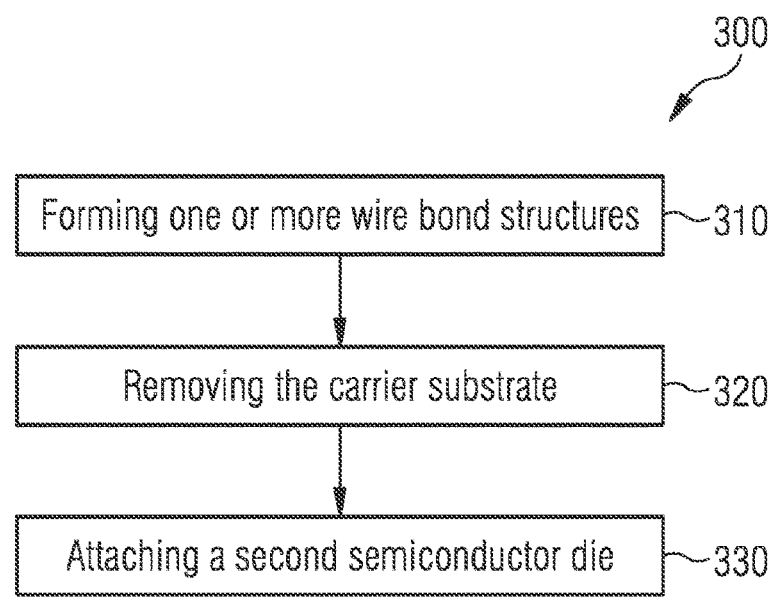
FIG. 3A shows a flow chart of a method for forming a semiconductor package.

FIG. 3A shows a flow chart of a method 300 for forming a semiconductor package.

The method 300 comprises forming 310 one or more wire bond structures next to a first semiconductor die. The wire bond structure comprises a bond interface portion formed on a removable carrier substrate. The method 300 further comprises removing 320 the carrier substrate to expose a surface of the bond interface portion of the wire bond structure. The method 300 further comprises attaching 330 a semiconductor device comprising a second semiconductor die so that an interface contact structure of the semiconductor device is attached to the exposed surface of the bond interface portion of the wire bond structure.

Due to the removing 320 of the carrier substrate to expose a surface of the bond interface portion of the wire bond structure, a more flexible approach to die attach processes may be achieved. For example, the wire bond structure is not necessary limited to being formed on a die pad structure, but instead, various connection structures (e.g. solder balls, solder bumps, die pads) may be attached to the exposed bond interface portion of the wire bond structure.

The method 300 may include a ball bonding process for forming the wire bond structure. Forming the wire bond structure may optionally include forming a free air ball (by an electrical flame off process) at the end of a wire. The bond interface portion of the wire bond structure may optionally be formed by a thermal compression process, for example. For example, the capillary thread may descend onto a surface of the removable carrier substrate so that the free air ball is pressed against the removable carrier substrate to form the nail-head bond interface portion. After forming the bond interface portion, and once the bond interface portion has bonded to the removable carrier substrate, forming the wire bond structure may further include forming the wire portion of the wire bond structure which extends from the bond interface portion of the wire bond structure. The wire portion of the wire bond structure may be formed by drawing a capillary to the desired portion of the wire at which the wire portion is to be terminated, or at which a second bond interface portion is to be formed. Forming the wire bond structure may further include terminating the wire portion of the wire bond structure at a first side of the semiconductor package, or on a die pad structure of the first semiconductor die, for example.

After forming the wire bond structure, the method 300 may further include forming a mold compound structure around (encapsulating) the wire bond structure and the first semiconductor die before removing the carrier substrate.

After forming the mold compound structure, the method 300 may further include planarizing (e.g. grinding) a surface of the mold compound structure before removing the carrier substrate to expose a plurality of interconnect structures electrically connected to the first semiconductor die and/or at least part of the wire bond structure 103 to be connected to a front side redistribution layer to be formed.

After planarizing the surface of the mold compound structure, the method 300 may, optionally, further include forming at least one front side redistribution layer at the front side of the first semiconductor die before removing the carrier substrate (and before attaching the semiconductor device). The front side redistribution layer may be electrically connected to an interface portion (e.g. an end portion) of the wire bond structure opposite to the bond interface portion of the wire bond structure.

After forming the at least one front side redistribution layer, the method 300 may further include forming a plurality of interface solder structures (e.g. solder balls) at a first side of the semiconductor package before removing the carrier substrate (and before attaching the semiconductor device). The solder structures of the plurality of interface solder structures may be electrically connected to the interconnect structures of the plurality of interconnect structures via the at least one front side redistribution layer. Optionally, if no front side redistribution layer is formed, the solder structures of the plurality of interface solder structures may be arranged directly on the die pad structures of the first semiconductor die.

The method 300 may further include removing 320 the carrier substrate to expose a surface of the bond interface portion of the wire bond structure after forming the wire bond structure, the front side redistribution layer and/or the plurality of interface solder structures. The removable carrier substrate may be (or may include) an adhesive sheet, a die-attach foil, a multi-layer foil or a plate (e.g. glass, plastic or metal). The carrier substrate may be removed by at least one process selected from the following group of processes: a peeling process, a shearing process, a dissolving process, a grinding process, and a radiation process.

The method 300 may optionally include forming (depositing) a back side redistribution layer at (or on) a back side of the first semiconductor die after removing 320 the carrier substrate. Additionally or optionally, at least part of the back side redistribution layer may be formed on the mold compound structure.

The method 300 may further include attaching the semiconductor device comprising the second semiconductor die after removing 320 the carrier substrate and/or after forming the optional back side redistribution layer. The semiconductor device may be arranged at a back side of the first semiconductor die. The semiconductor device may be arranged so that the first semiconductor die and the bond interface portion of the wire bond structure are arranged at the same side of the semiconductor device. Attaching the semiconductor device may include soldering the interface contact structure of the semiconductor device to the bond interface portion of the wire bond structure. If the back side redistribution layer has been formed, the semiconductor device may be attached so that the contact structure of the semiconductor device may be attached to the exposed surface of the bond interface portion of the wire bond structure via the back side redistribution layer.

If the semiconductor device is not a package, but just the bare second semiconductor die, the method 300 may further include forming an over-mold compound structure around (e.g. encapsulating) the second semiconductor die after attaching the second semiconductor die. The over-mold compound structure may surround the second semiconductor die and the underfill material arranged between the first semiconductor die and the second semiconductor die.

FIG. 3B shows a schematic illustration of at least part of the method 300.

As shown in FIG. 3B, the method 300 may include attaching a semiconductor device. FIG. 3B shows the example in which the semiconductor device comprises (or is) the bare semiconductor die 102. The method may include attaching the second semiconductor die 102 so that the interface contact structure 107 of the second semiconductor die 102 is attached to the exposed surface 321 of the bond interface portion 104 of the wire bond structure 103. For example, FIG. 3B shows a second semiconductor die 102 (e.g. a Si die) being connected to the wire bond structure 103 by a solder 107 to nail head 104 connection. The die attach may be carried out via the soldering of the second semiconductor die 102 to the uncovered nail head area of the wire bond structure 103.

More details and aspects are mentioned in connection with the examples described above or below. The examples shown in FIGS. 3A to 3B may each comprise one or more optional additional features corresponding to one or more aspects mentioned in connection with the proposed concept or one or more examples described above (e.g. FIGS. 1A to 2E) or below (FIGS. 4A to 15).

FIGS. 4A to 4L show schematic illustrations of a method 400 for forming a semiconductor package. The method 400 may include one or more or all of the features already described in connection with method 300.

As shown in the schematic illustration 400 of FIG. 4A, the method 400 may include arranging a first semiconductor die 101 on the removable carrier substrate 422. The first semiconductor die 101 may include a plurality of interconnect structures 111 (e.g. Cu studs) arranged at the front side 112 of the first semiconductor die 101. Each (or a) interconnect structure 111 may include a die pad portion (e.g. a die pad structure) arranged at the front side 112 of the first semiconductor die 101 and a via portion (e.g. a stud portion) arranged on the die pad portion. For example, FIG. 4A shows a silicon die 101 with Cu studs (which may be formed on pad), with the silicon die 101 being attached to the removable carrier substrate 422.

As shown in the schematic illustration 410 of FIG. 4B, the method 400 may include forming a (or e.g. at least one) wire bond structure 103 (providing a direct via connection) next to the first semiconductor die 101. The wire bond structure 103 may be spaced laterally apart from a vertical edge of the first semiconductor die 101, and may be adjacent to the vertical edge of the first semiconductor die 101. As shown in FIG. 4B, the bond interface portion 104 of the wire bond structure 103 may be formed on the removable carrier substrate 422 by thermal compression and/or ultrasonic vibration for example.

The removable carrier substrate 422 may include a metal (e.g. copper) foil 423 formed on a carrier foil 424. Due to the first semiconductor die 101 and the wire bond structure 103 both being arranged on a surface of the removable carrier substrate 422, a lateral surface 426 of the bond interface portion 104 may be located at a level of (e.g. the same level as) the back side 109 of the first semiconductor die 101.

As shown in FIG. 4B, the wire 103 may be attached to the carrier 422. To build the nail head 104 that can be molded later on, the copper foil 423 (single sided or double sided) may be attached on top of the carrier 422. This may be removed later on at the de-taping process so that a nail head 104 (which is not covered with mold) remains. At this nail head 104, a second semiconductor die or a semiconductor device (e.g. a semiconductor package comprising a second semiconductor die) may subsequently be attached via solder.

Figure 4C:
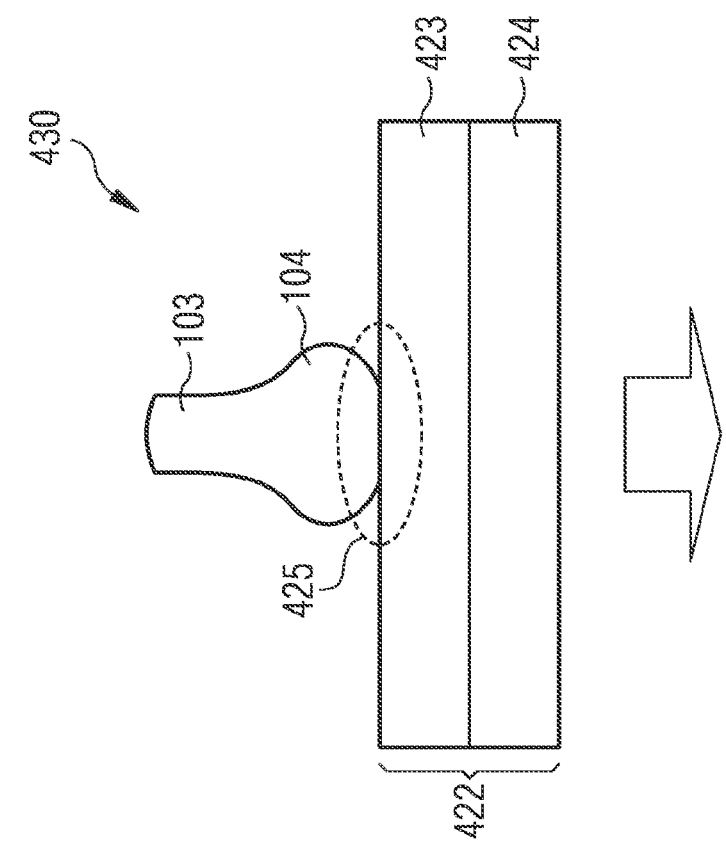
Figure 4C:
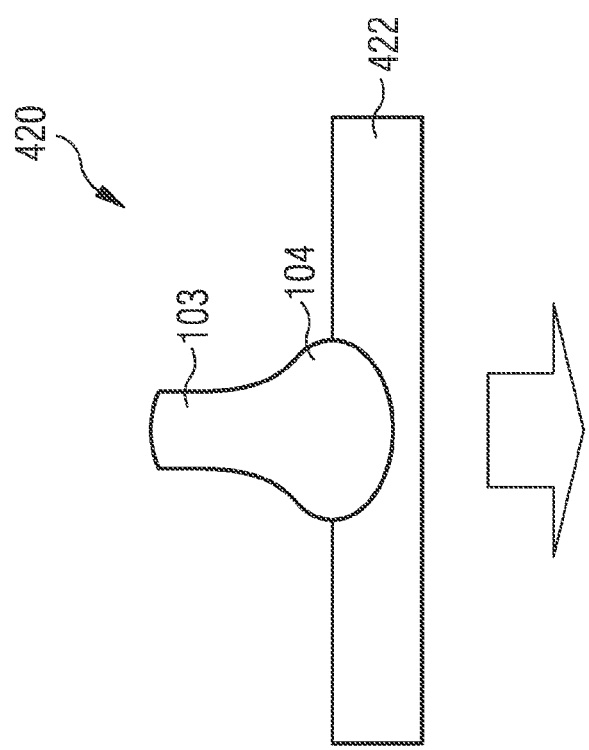

As shown in FIG. 4C, the removable carrier substrate 422 may be (or may include) an adhesive sheet, a die-attach foil or a multi-layer foil. As shown in schematic illustration 420, the bond interface portion 104 of the wire bond structure 103 may optionally be formed directly on the foil (e.g. on a carrier tape, or e.g. on an adhesive). This may allow for direct use of the bond interface portion 104 for die attach of the second semiconductor die 102 after detaping of the foil.

Alternatively, as shown in the schematic illustration 430, the bond interface portion 104 of the wire bond structure 103 may be formed on a sacrificial layer 423, which may be a metal carrier layer (e.g. a gold layer, or e.g. a silver layer or, e.g. a copper layer), or alternatively an oxide layer. Post treatment of the bond ball surface (e.g. via grinding, and/or wet chemistry) may be used before using the bond interface portion 104 for die attach of the second semiconductor die 102.

It may be understood that different processes for generating the bond nail head 104 for the subsequent die attach may be carried out. For example, the adhesion force at the interface 425 of the bond ball 104 to the surface (of the removable carrier 422) need only be strong enough to withstand the molding process. For example, reliability requirements expected of wire-bond to pad bonding may not be required. The bond ball 104 may optionally be formed e.g. during the wire bond process or via a free air ball. The bond interface portion 104 may be formed by bonding the bond ball 104 on the foil, a surface (sacrificial layer), an electrically conductive layer (with good intermetallic phases) and/or an electrically conductive layer (with poor intermetallic phases and mechanic anchor).

Figure 4D:
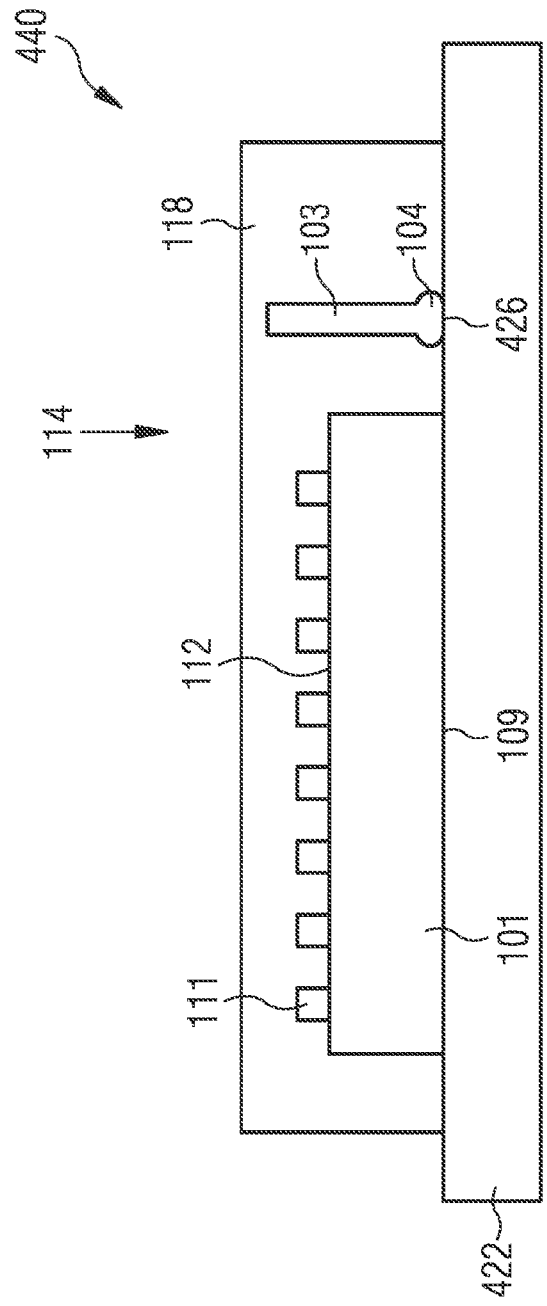

As shown in the schematic illustration 440 of FIG. 4D, after forming the wire bond structure, the method 300 may further include forming the mold compound structure 118 (e.g. molding) around the wire bond structure 103 and the first semiconductor die 101 before removing (e.g. by detaping) the carrier substrate 422. FIG. 4D shows the setup after molding. The mold compound structure 118 may encapsulate (e.g. surround) the first semiconductor die 101 and the wire bond structure 103 except at the back side 109 of the first semiconductor die and except at the surface 426 of the bond interface portion 104. Additionally, the mold compound structure may encapsulate the plurality of interconnect structures 111 of the first semiconductor die 101.

Figure 4E:
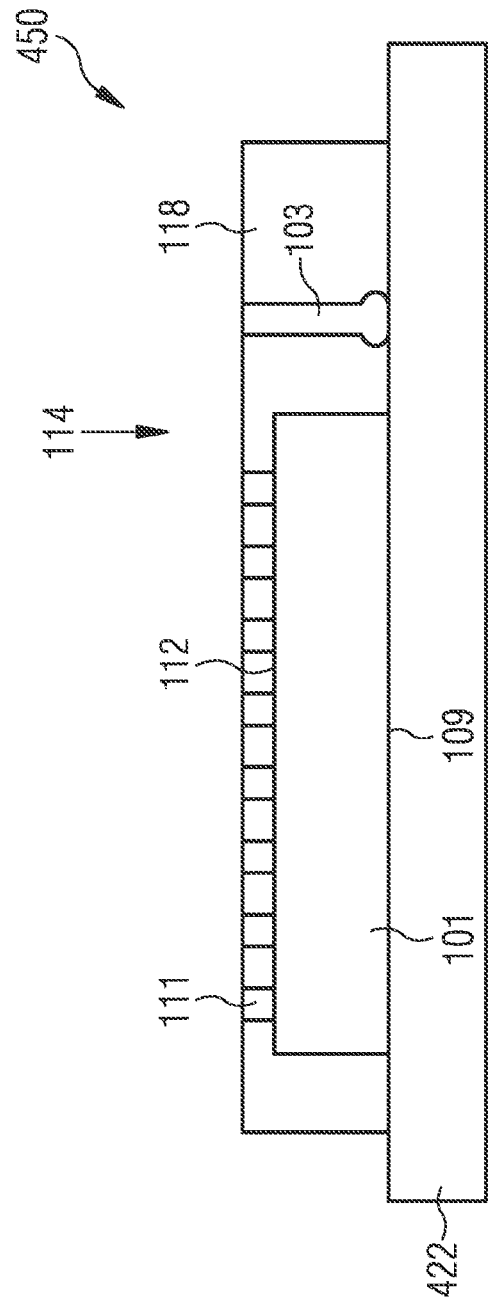

As shown in the schematic illustration 450 of FIG. 4E, the method 400 may further include planarizing (e.g. grinding) a surface of the mold compound structure 118 before removing the carrier substrate 422 to expose the plurality of interconnect structures 111 at the first side 114 of the semiconductor package to be formed.

Figure 4F:
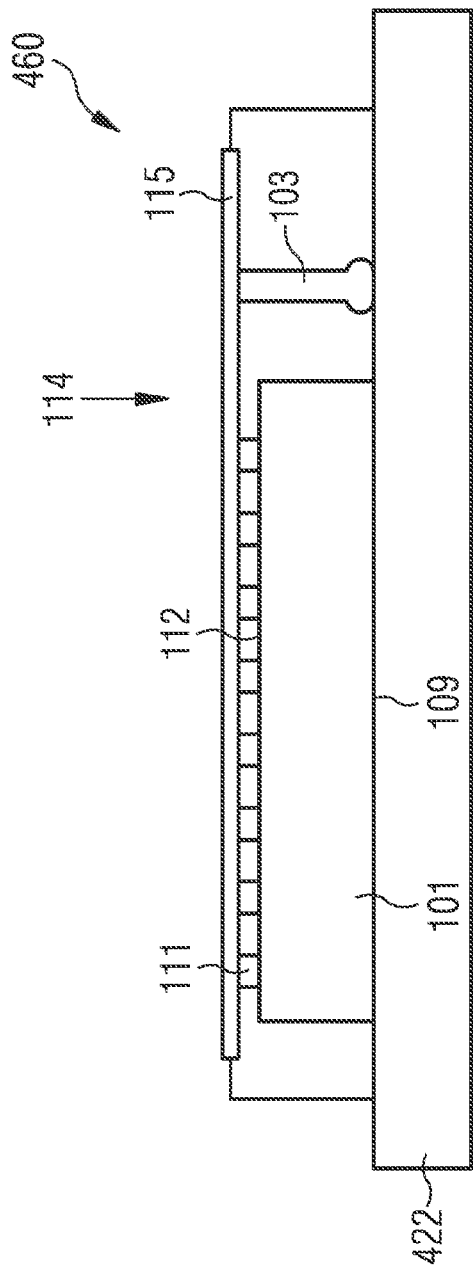

As shown in the schematic illustration 460 of FIG. 4F, after planarizing the surface of the mold compound structure 118, the method 400 may, optionally, further include forming (e.g. depositing) at least one front side redistribution layer 115 at the front side 112 of the first semiconductor die before removing the carrier substrate 422. The at least one front side redistribution layer 115 may be electrically connected to an end of the wire portion of the wire bond structure 103. Thus, the wire bond structure 103 may extend from a level of (e.g. the same vertical level as) the back side of the first semiconductor die 101 to the front side redistribution layer 115.

Figure 4G:
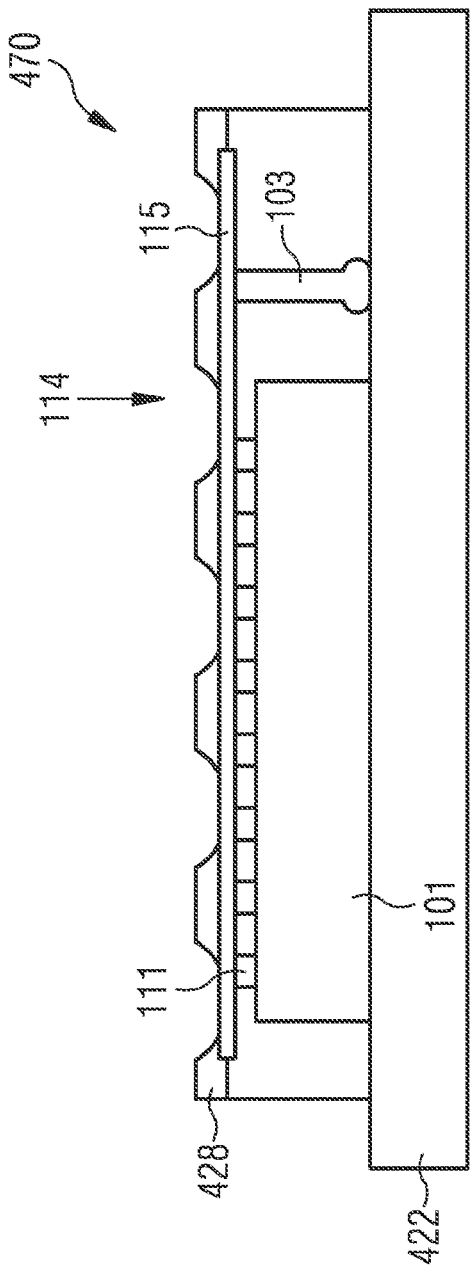

As shown in the schematic illustration 470 of FIG. 4G, after forming the front side redistribution layer 115, the method 400 may further include forming a solder mask structure. Forming the solder mask structure may include forming (e.g. depositing) a solder mask layer on the front side redistribution layer 115 and removing portions of the solder mask layer to expose a plurality of portions of the front side redistribution layer (e.g. to form openings of the solder mask structure).

Figure 4H:
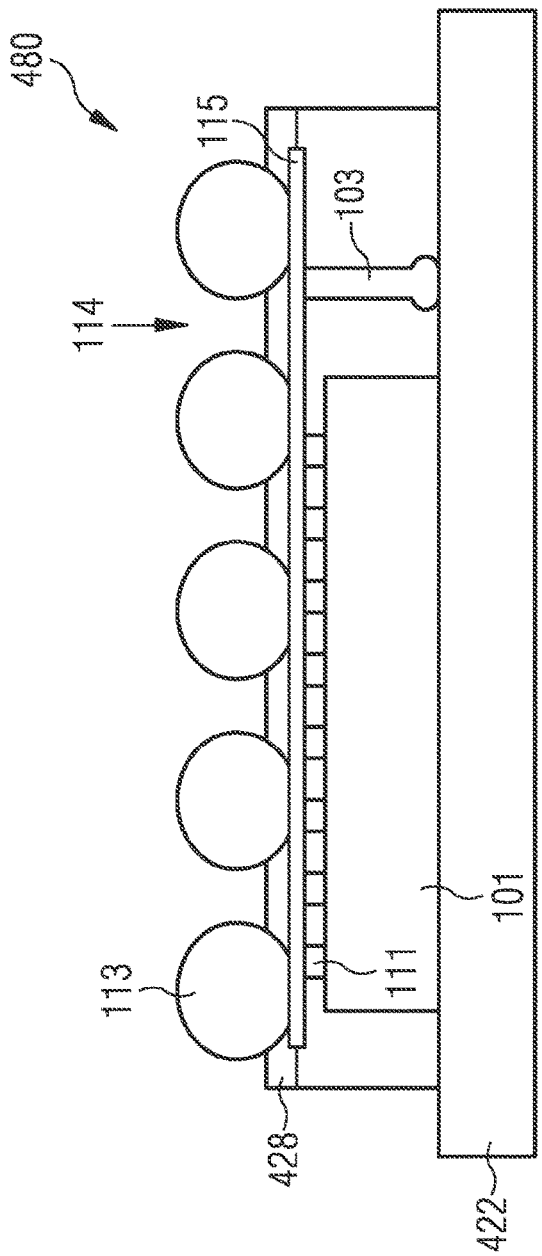

As shown in the schematic illustration 480 of FIG. 4H, after forming the solder mask structure, the method 400 may include forming a plurality of interface solder structures 113 (in a ball apply process) in the plurality of exposed portions of the front side redistribution layer. In this way, an electrical connection may be formed between the (die pads of the) first semiconductor die 101 and the plurality of interface solder structures 113. The plurality of interface solder structures 113 (e.g. solder balls) may be arranged at the first side 114 of the semiconductor package and may be configured to provide a connection to a carrier structure (e.g. a printed circuit board or an interposer carrier structure), for example.

Figure 4I:
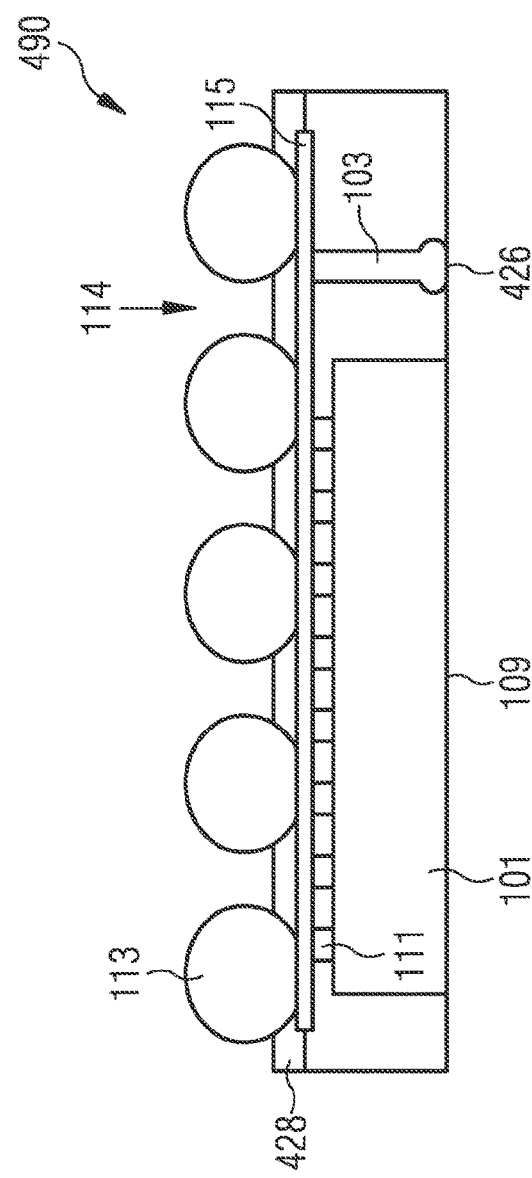

As shown in the schematic illustration 490 of FIG. 4I, after forming the plurality of interface solder structures 113, the method may include removing the carrier substrate (e.g. by detaping) to expose the surface 426 of the bond interface portion 104 of the wire bond structure 103, and to expose the back side 109 of the first semiconductor die 101. The bond interface portion 104 is thus uncovered for die attach, for example.

Figure 4J:
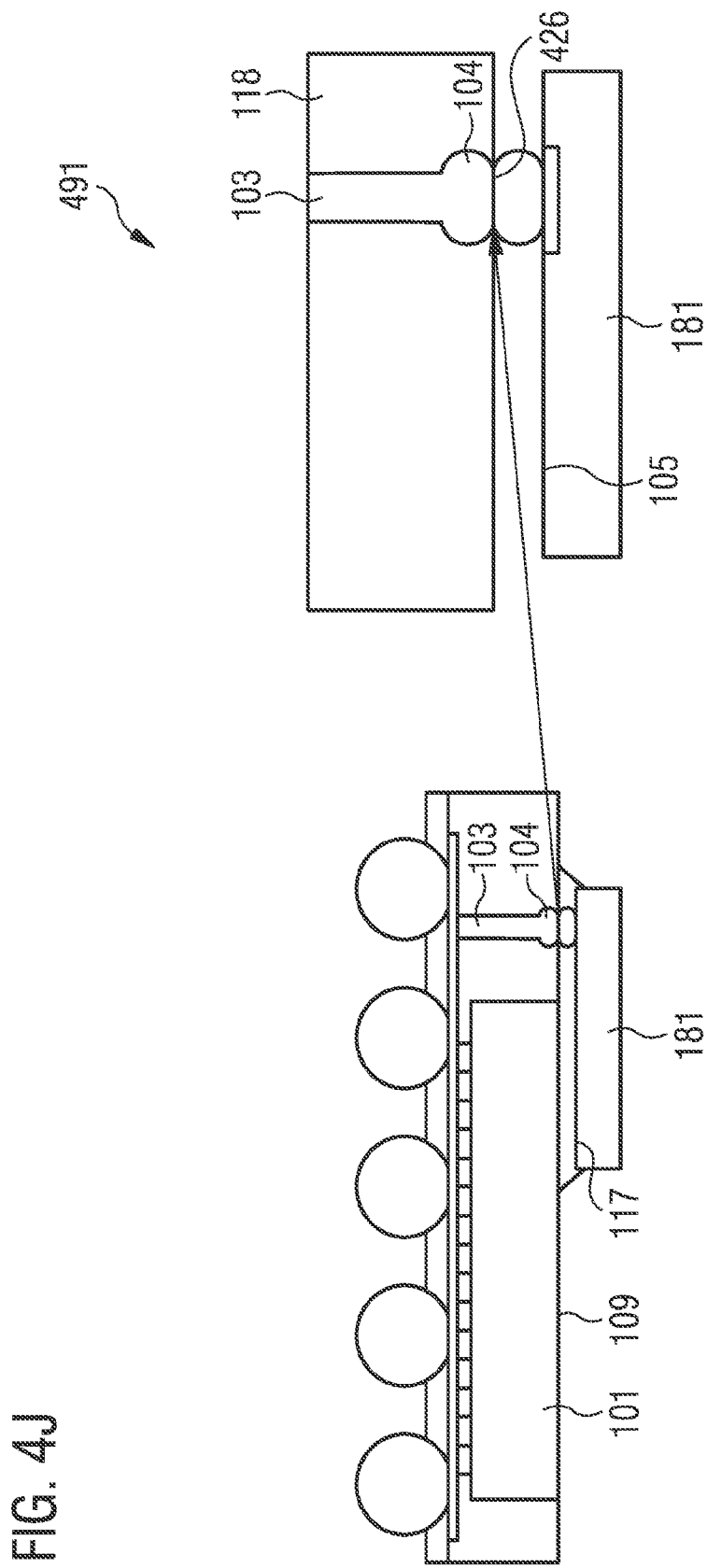

As shown in the schematic illustration 491 of FIG. 4J, after removing the carrier substrate, the method 400 may include attaching (e.g. in a die attach process) the second semiconductor die (e.g. a memory die) or a semiconductor device 181 (e.g. a semiconductor package comprising a second semiconductor die) so that an interface contact structure 107 of the semiconductor device 181 is attached to the exposed surface 426 of the bond interface portion 104 of the wire bond structure 103. The interface contact structure 107 of the semiconductor device 181 may be soldered to the bond interface portion 104 of the wire bond structure 103.

The method 400 may further include arranging an adhesive underfill material between the first semiconductor die 101 and the semiconductor device 181 after attaching the semiconductor device 181. The underfill material may adhere (e.g. attach) at least part of the front side 105 of the semiconductor device 181 to the back side 109 of the first semiconductor die 101 or to a back side layer (e.g. a back side redistribution layer) formed on the back side 109 of the first semiconductor die 101.

Figure 4K:
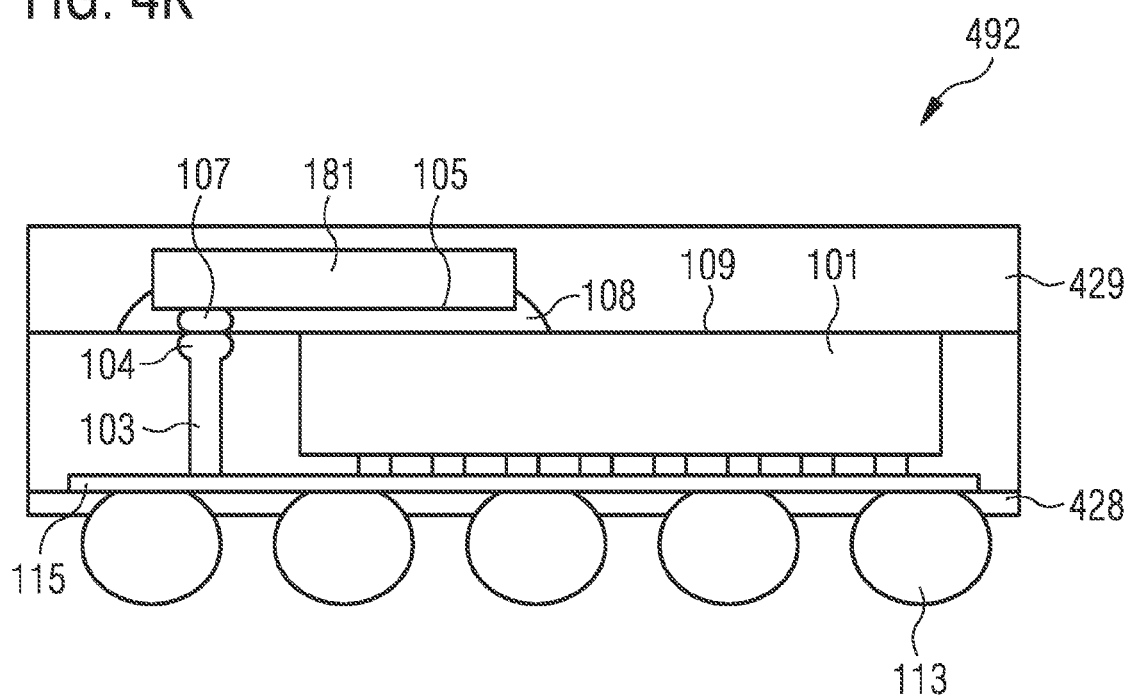

As shown in the schematic illustration 492 of FIG. 4K, after attaching the semiconductor device 181, the method 400 may further include forming an over-mold compound structure 429 around (e.g. encapsulating) the semiconductor device 181 after attaching the semiconductor device 181. In the case of the semiconductor device 181 being a bare die, the over-mold compound structure 429 may be formed in a final process overmolding the (top) second semiconductor die. In the case of the semiconductor device 181 being a semiconductor package comprising the second semiconductor die, the over-mold compound structure 429 may surround the entire package 181.

Figure 4L:
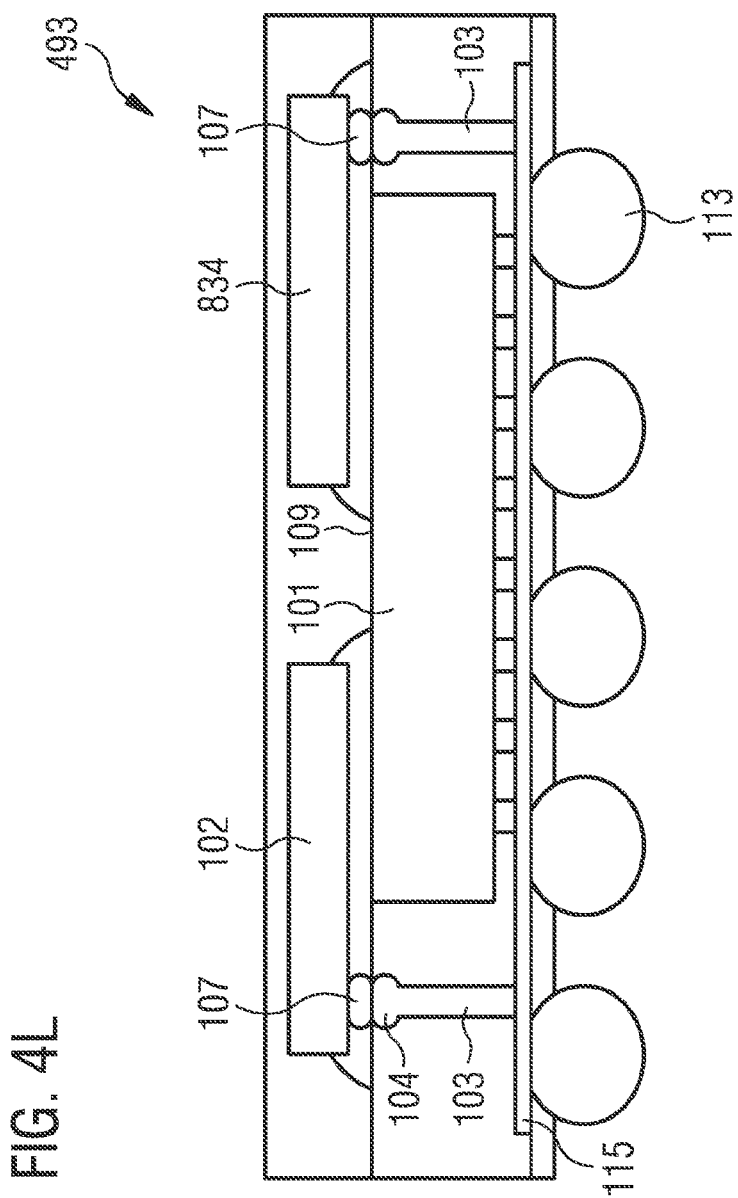

As shown in the schematic illustration 493 of FIG. 4L, more than one semiconductor die (e.g. a plurality of semiconductor dies) may be attached at the back side 109 of the first semiconductor die 101. For example, in the case of the semiconductor device being a bare die, a second semiconductor die 102 may be arranged at the back side 109 of the first semiconductor die 101 and may be connected to at least one wire bond structure 103 (e.g. a first direct wire bond structure 103). A third semiconductor die 834 may be arranged at the back side 109 of the first semiconductor die 101 and may be connected to at least one wire bond structure 103 (e.g. a second direct wire bond structure 103). The over-mold compound structure 429 may be formed around (e.g. encapsulating) the second semiconductor die 102 and the third semiconductor die 834. The over-mold compound structure 429 may further encapsulate the underfill material 108 adhering the second semiconductor die 102 and the third semiconductor die 834 to the first semiconductor die 101.

More details and aspects are mentioned in connection with the examples described above or below. The examples shown in FIGS. 4A to 4L may each comprise one or more optional additional features corresponding to one or more aspects mentioned in connection with the proposed concept or one or more examples described above (e.g. FIGS. 1A to 3B) or below (FIGS. 5A to 15).

Figure 5A:
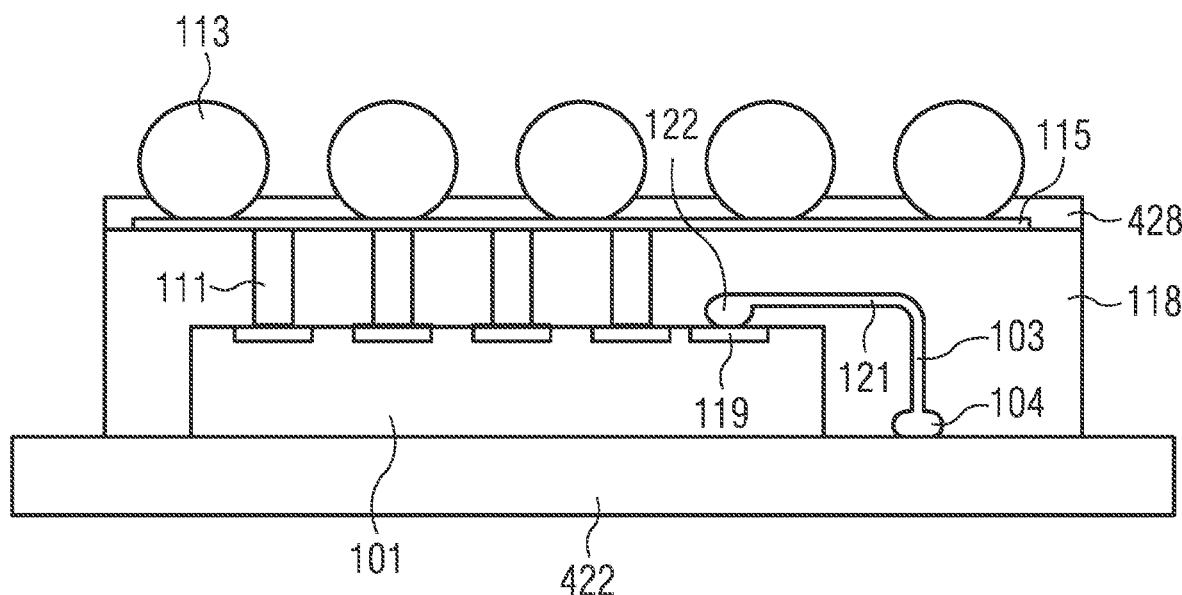
FIGS. 5A to 5B show schematic side view illustrations of a method for forming a semiconductor package with a loop wire bond structure.
Figure 5B:
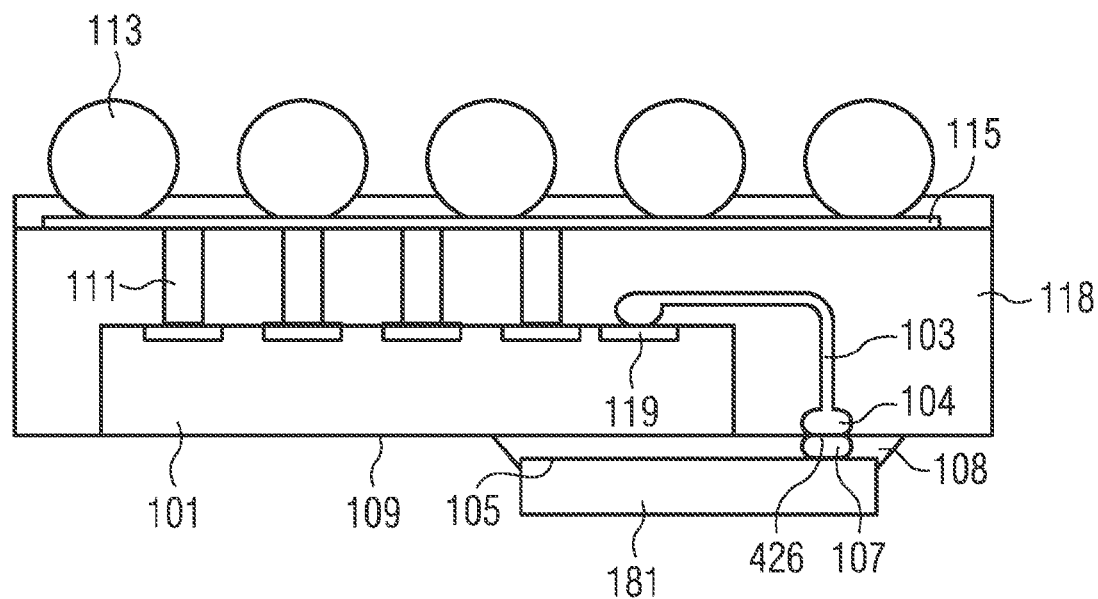

FIGS. 5A and 5B show schematic illustrations of a method 500 for forming a semiconductor package. The method 500 may include one or more or all of the features already described in connection with method 400.

FIG. 5A shows the forming of a loop wire bond structure 103. The first bond interface portion 104 (e.g. a nail-head structure) of the loop wire bond structure 103 may be formed on a surface of the removable carrier substrate 422. For example, FIG. 5A shows a semiconductor package to be formed by the method 500 including a molded Si die 101 with studs 111 on pads 119 and a loop wire 103. The semiconductor package may further include a redistribution layer 115 and a solder mask 428 for ball apply 113.

Forming the wire bond structure 103 may include forming the first bond interface portion 104, and forming the first wire portion 121 extending from the first bond interface portion 104 to a second bond interface portion 122 of the wire bond structure 103. The second bond interface portion 122 (e.g. a nail-head structure) may be formed on the die pad structure 119 of the first semiconductor die 101 by thermal compression, for example.

FIG. 5B shows the attaching of the semiconductor device 181 after removing the removable carrier substrate 422, so that an interface contact structure of the semiconductor device 181 is attached to the exposed surface 426 of the bond interface portion 104 of the wire bond structure 103. For example, FIG. 5B shows a semiconductor package after de-taping and die attach.

More details and aspects are mentioned in connection with the examples described above or below. The examples shown in FIGS. 5A to 5B may each comprise one or more optional additional features corresponding to one or more aspects mentioned in connection with the proposed concept or one or more examples described above (e.g. FIGS. 1A to 4L) or below (FIGS. 6A to 15).

FIGS. 6A to 6D show schematic illustrations of a method 600 for forming a semiconductor package. The method 600 may include one or more or all of the features already described in connection with method 600.

Figure 6A:
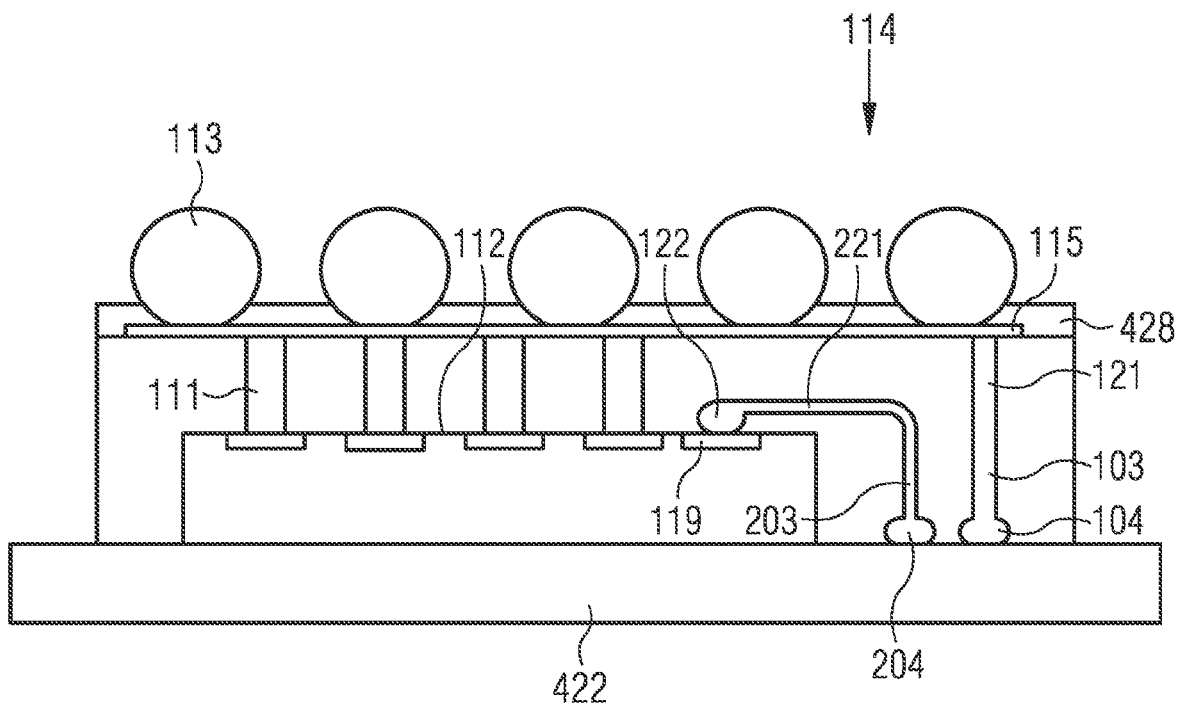
FIGS. 6A to 6D show schematic side view illustrations of a method for forming semiconductor packages with a plurality of wire bond structures.

FIG. 6A shows the forming of a first wire bond structure 103 and a second wire bond structure 203. For example, FIG. 6A shows a semiconductor package including a molded Si die 101 with studs 111 on pads 119, a loop wire 203 and a direct wire 103. The semiconductor package may further include a front side redistribution layer 115 and a solder mask 428 for a ball apply process.

The bond interface portion 104 (e.g. a nail-head structure) of the wire bond structure 103 may be formed on a surface of the removable carrier substrate 422. Forming the first wire bond structure 103 may include forming the first bond interface portion 104, and forming the wire portion 121 extending from the bond interface portion 104 towards the first side 114 of the semiconductor package, so that at least one front side redistribution layer 115 to be formed may be electrically connected to an end of the wire portion of the wire bond structure 103. The method may further include forming a second wire bond structure 203. The bond interface portion 204 of the second wire bond structure 203 (e.g. a loop wire bond structure) may be formed on a surface of the removable carrier substrate 422. Forming the second wire bond structure 203 may include forming the first bond interface portion 204 of the second wire bond structure 203, and a wire portion 221 of the second wire bond structure 203 extending from the first bond interface portion 204 of the second wire bond structure 203 to a die pad structure 119 arranged at the front side 112 of the first semiconductor die 101. Forming the second wire bond structure 203 may further include forming a second bond interface portion 122 of the second wire bond structure 203 on the die pad structure 119 of the first semiconductor die 101. The second bond interface portion 122 of the wire bond structure 203 may include (or may be) a nail head structure or a wedge structure.

Figure 6B:
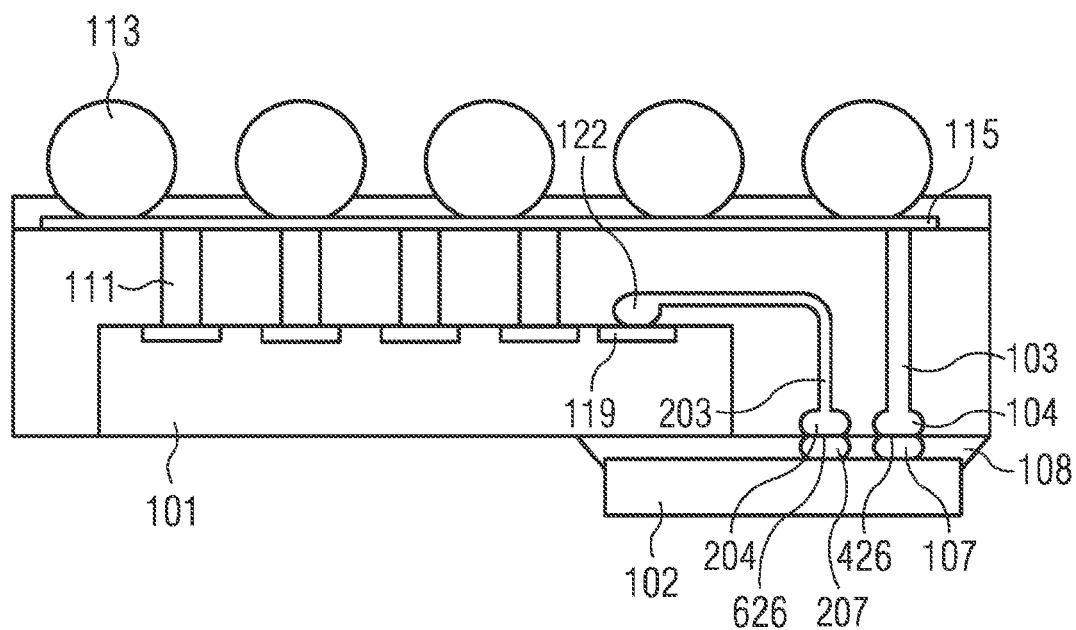

FIG. 6B shows the attaching of the second semiconductor die 102 (or a semiconductor device comprising the second semiconductor die 102) after removing the removable carrier substrate 422, so that a first interface contact structure 107 of the second semiconductor die 102 is attached to the exposed surface 426 of the bond interface portion 104 of the first wire bond structure 103, and so that a second interface contact structure 207 of the second semiconductor die 102 is attached to the exposed surface 626 of the first bond interface portion 204 of the second wire bond structure 203. For example, FIG. 6B shows a semiconductor package after de-taping and die attach.

Figure 6C:
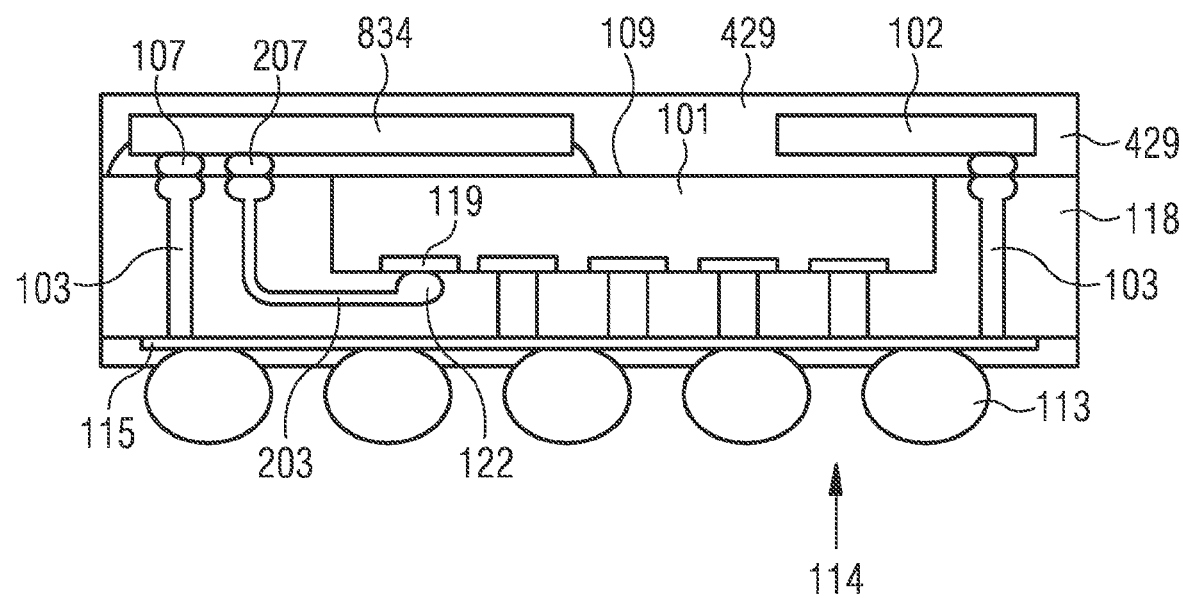
Figure 6D:
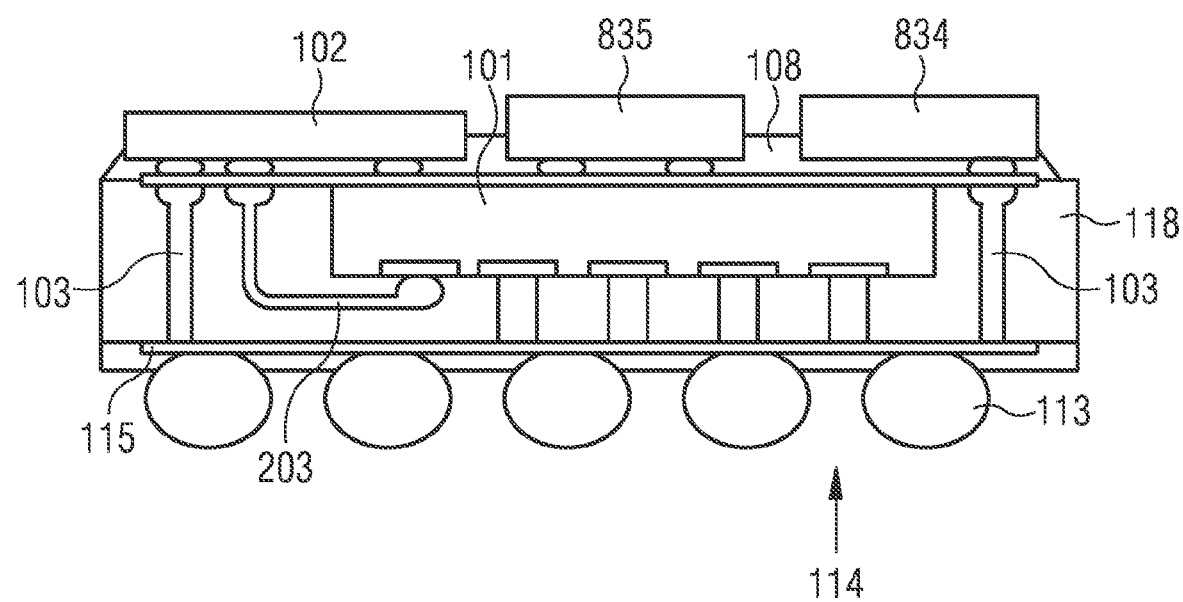

FIGS. 6C and 6D show that more than one semiconductor die may be attached at the back side 109 of the first semiconductor die 101. For example, as shown in FIG. 6C, a third semiconductor die 834 may be arranged at the back side 109 of the first semiconductor die 101 and may be connected to at least one further wire bond structure 103. Optionally, the second semiconductor die 102 may be a memory die and the third semiconductor die 834 may be a transceiver die, for example.

As shown in FIG. 6D, three semiconductor dies may be arranged at the back side 109 of the first semiconductor die 101. The second semiconductor die 102 (e.g. a sensor die) may be connected to a direct wire bond structure 103 and a loop wire bond structure 203, for example. A third semiconductor die 834 (e.g. a sensor die) may be arranged at the back side 109 of the first semiconductor die 101 and may be connected to a second direct wire bond structure 103. A fourth semiconductor die 835 may be arranged at the back side 420. The fourth semiconductor die 835 may not necessarily be connected to a wire bond structure.

Optionally, an over-mold compound structure may be arranged around (e.g. encapsulating) the second semiconductor die 102 and the third semiconductor die 834, the fourth semiconductor die 835 and the underfill material 108, for example.

More details and aspects are mentioned in connection with the examples described above or below. The examples shown in FIGS. 6A to 6D may each comprise one or more optional additional features corresponding to one or more aspects mentioned in connection with the proposed concept or one or more examples described above (e.g. FIGS. 1A to 5B) or below (FIGS. 7A to 15).

Figure 7A:
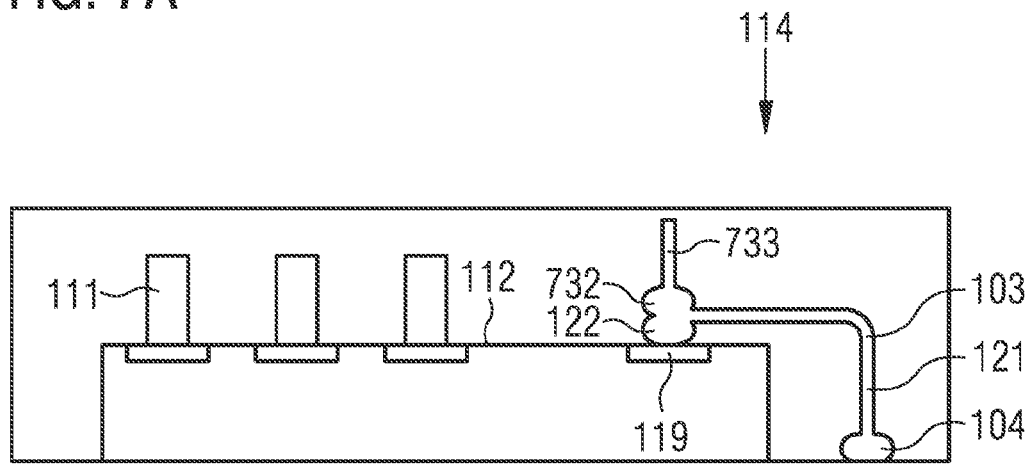
FIGS. 7A to 7B show schematic side view illustrations of a method for forming a semiconductor package with a wire bond structure connected to a redistribution layer via a die pad structure.
Figure 7B:
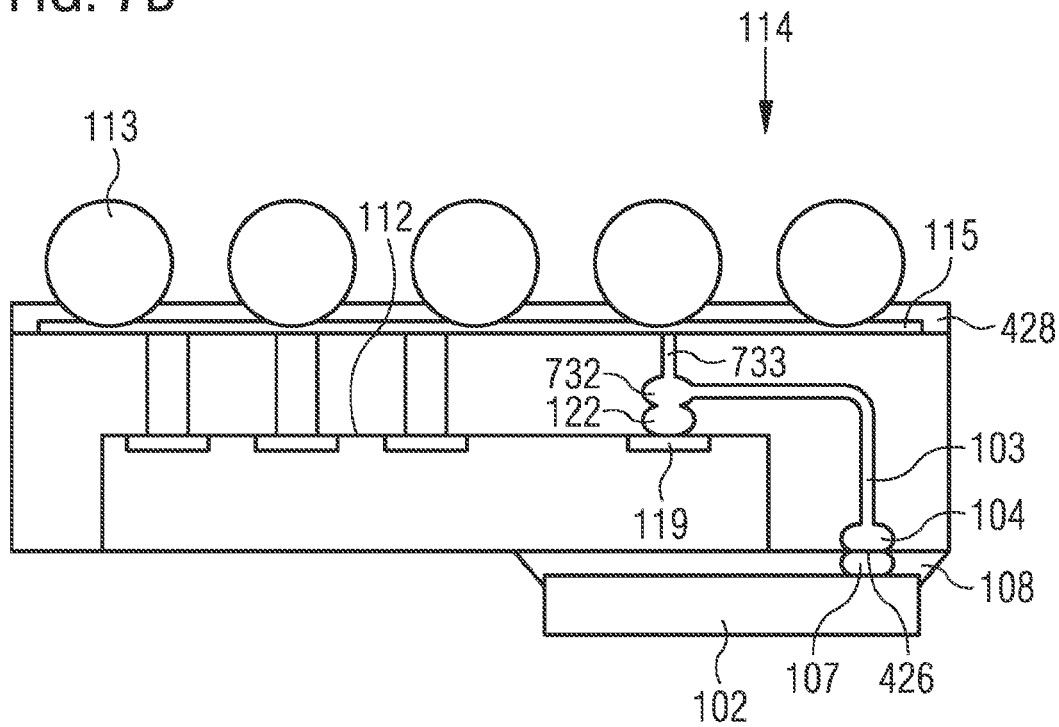

FIGS. 7A and 7B show schematic illustrations of a method 700 for forming a semiconductor package. The method 700 may include one or more or all of the features already described in connection with method 700.

FIG. 7A shows the forming of a loop-direct wire bond structure 103. For example, FIG. 7A shows a semiconductor package including a molded Si die 101 with studs 111 on pads 119, and a nail-head-on nail-head bonding of a loop wire portion 121 and a direct wire portion 733, to connect to a redistribution layer 115 to be formed.

Forming the wire bond structure 103 may include forming a first bond interface portion 104 of the wire bond structure 203, and a wire portion 121 of the wire bond structure 103 extending from the first bond interface portion 104 of the wire bond structure 103 to a die pad structure 119 arranged at the front side 112 of the first semiconductor die 101. Forming the wire bond structure 103 may further include forming a second bond interface portion 122 of the wire bond structure 103 on the die pad structure 119 of the first semiconductor die 101. The second bond interface portion 122 of the wire bond structure 103 may include (or may be) a nail head structure or a wedge structure. The first wire portion 121 may extend from the first bond interface portion 104 to the second bond interface portion 122 of the wire bond structure 103. Forming the wire bond structure 103 may further include forming a third bond interface portion 732 on (or attached to) the second bond interface portion 122 of the wire bond structure 103. The second bond interface portion 122 of the wire bond structure 103 and the third bond interface portion 732 of the wire bond structure 103 may be connected (or joined, or soldered together) via a nail-head on nail-head bond. Forming the wire bond structure 103 may further include forming a second wire portion 733 of the wire bond structure 103 extending from the third bond interface portion 732 and ending at the first side 114 of the semiconductor package, so that at least one front side redistribution layer to be formed may be electrically connected to an end of the second wire portion 733 of the wire bond structure 103. Although only one wire bond structure 103 is shown in FIG. 7A, it may be understood that one or more wire bond structures may be formed.

FIG. 7B shows the attaching of the second semiconductor die 102 after removing the removable carrier substrate 422, so that an interface contact structure 107 of the second semiconductor die 102 is attached to the exposed surface 426 of the bond interface portion 104 of the wire bond structure 103. For example, FIG. 7B shows a semiconductor package after grinding, after deposition of the redistribution layer, after depositing a solder mask 428 layer and forming openings, after ball apply, after de-taping and after die-attach.

More details and aspects are mentioned in connection with the examples described above or below. The examples shown in FIGS. 7A to 7B may each comprise one or more optional additional features corresponding to one or more aspects mentioned in connection with the proposed concept or one or more examples described above (e.g. FIGS. 1A to 6D) or below (FIGS. 8 to 15).

Figure 8:
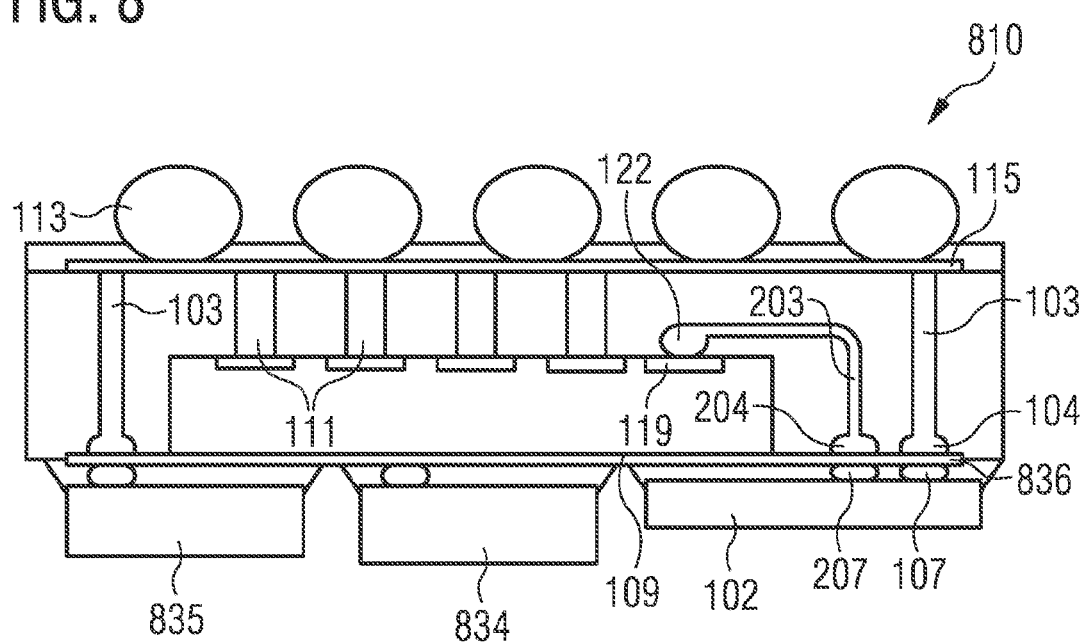
FIG. 8 shows a schematic side view illustration of a method for forming a semiconductor package with a front side distribution layer and a back side distribution layer.

FIG. 8 shows at least part of a method 800 for forming a semiconductor package 810. The method 800 may include forming a back side redistribution layer 836 at a back side 109 of the first semiconductor die 101 after removing the carrier substrate. The method 800 may further include attaching a plurality of semiconductor dies after removing the carrier substrate.

The semiconductor package 810 to be formed by the method 800 may include the front side redistribution layer 115 and the back side redistribution layer 836. The semiconductor package 810 may further include two sided direct wires 103 (e.g. direct wire bond structures 103) arranged adjacent two opposite vertical edges of the first semiconductor die 101) and a single sided loop wire 203 arranged adjacent to a vertical edge of the first semiconductor die 101, for example.

Each semiconductor die may be arranged at the back side 109 of the first semiconductor die 107. Attaching the second semiconductor die 102 (e.g. a memory die) may include connecting a first contact structure 107 of the second semiconductor die 102 to the bond interface portion 104 of the first wire bond structure 103 (e.g. a direct wire bond structure 103), and connecting a second contact structure 207 of the second semiconductor die 102 to the bond interface portion 204 of the second wire bond structure 203 (e.g. a loop wire bond structure). The second semiconductor die may be connected to the first wire bond structure 103 and the second wire bond structure 203 via the back side redistribution layer 836. A third semiconductor die 835 (e.g. an integrated passive components die) arranged at the back side 109 of the first semiconductor die 101 may be connected to at least one further wire bond structures 103 (e.g. to a second direct wire bond structure 103). Additionally or optionally, a fourth semiconductor die 834 (e.g. a sensor die) may be arranged at the back side 109 of the first semiconductor die. The fourth semiconductor die 834 may not necessarily be connected to a wire bond structure, but may include interface solder structures which may be electrically connected to the back side 109 of the first semiconductor die 101 or to the back side redistribution layer 836 arranged at the back side 109 of the first semiconductor die 101.

More details and aspects are mentioned in connection with the examples described above or below. The examples shown in FIG. 8 may comprise one or more optional additional features corresponding to one or more aspects mentioned in connection with the proposed concept or one or more examples described above (e.g. FIGS. 1A to 7B) or below (FIGS. 9A to 15).

FIGS. 9A to 9F show schematic illustrations of a method 900 for forming a semiconductor package. The method 900 may include one or more or all of the features already described.

Figure 9A:
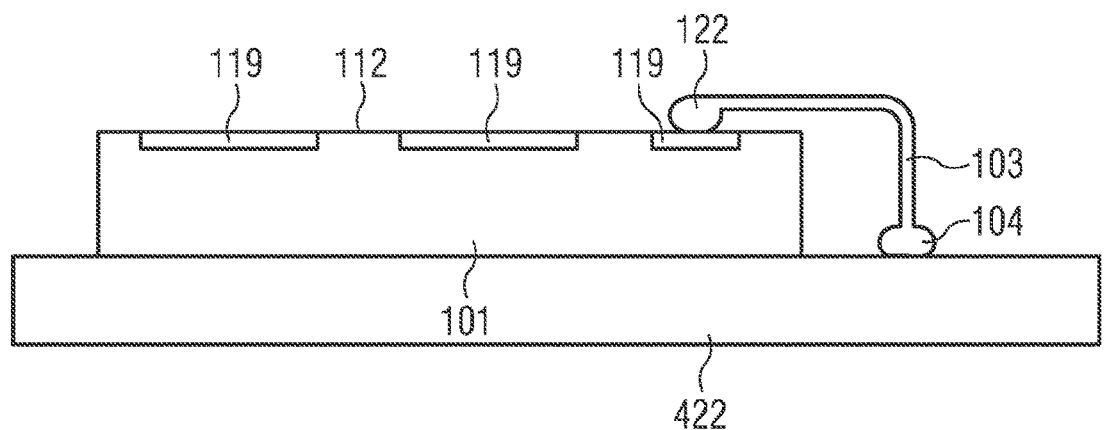
FIGS. 9A to 9F show schematic side view illustrations of a method for forming a semiconductor package with interface solder structures arranged on die pad structures.

As shown in FIG. 9A, the method 900 may include arranging the first semiconductor die 101 (e.g. a Si die) on a removable carrier 422 and forming a loop wire connection 103. The first semiconductor die 101 may include a plurality of die pad structures 119 arranged at the front side 112 of the first semiconductor die 101. The method 900 may further include forming a (or e.g. at least one) wire bond structure 103 next to the first semiconductor die 101. The first bond interface portion 104 of the wire bond structure 103 may be formed on the removable carrier substrate 422. The second bond interface portion 122 may be formed on a die pad structure 119 of the first semiconductor die 101. For example, the loop wire bond structure 103 may be formed by reverse bonding.

Figure 9B:
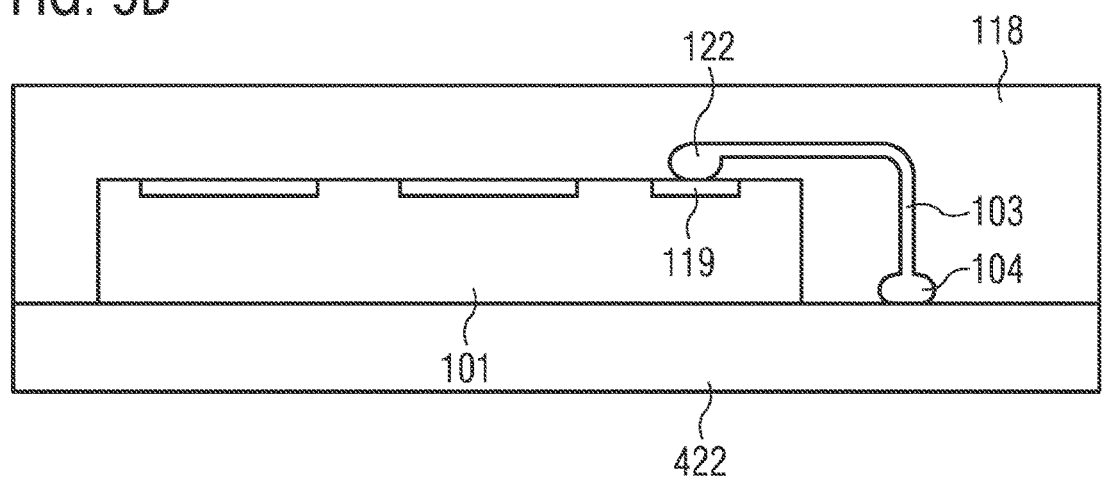

As shown in FIG. 9B, after forming the wire bond structure 103, the method 900 may further include forming a mold compound structure 118 (e.g. molding) around the wire bond structure 103 and the first semiconductor die 101 before removing the carrier substrate 422.

Figure 9C:
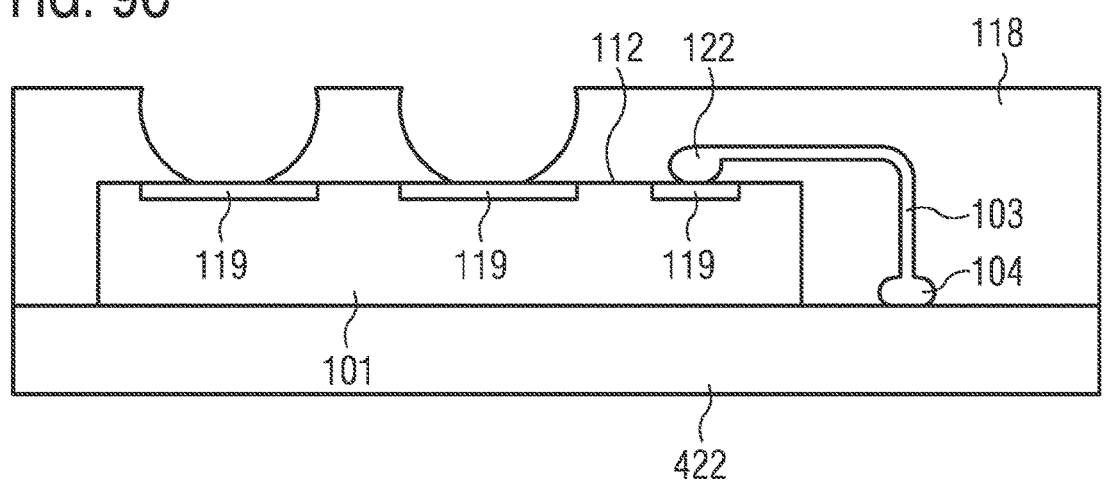

As shown in FIG. 9C, the method 900 may further include forming openings in the mold compound structure 118 to expose the plurality of die pad structures 119 which are not connected to a wire bond structure.

Figure 9D:
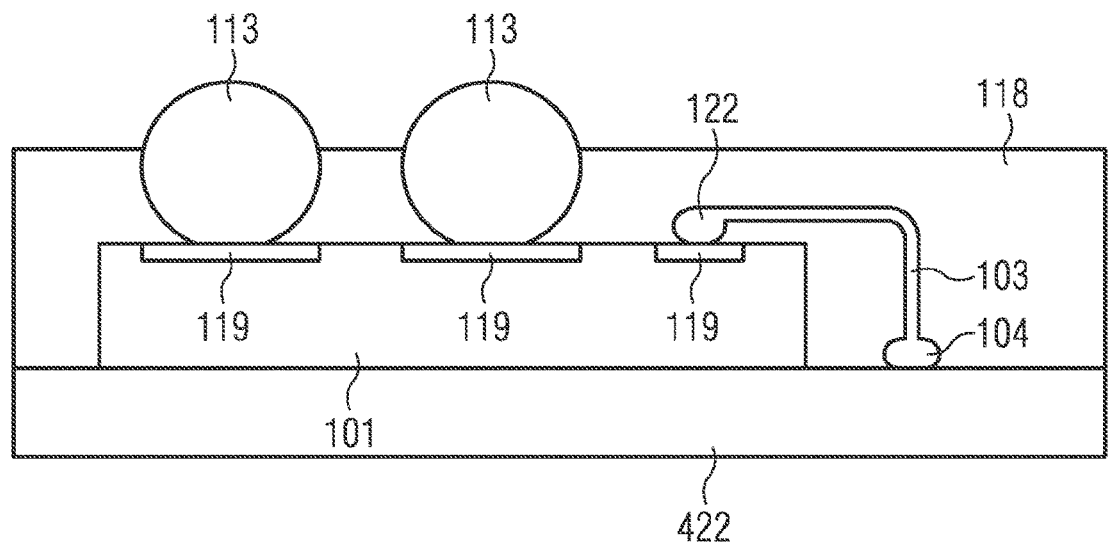

As shown in FIG. 9D, the method 900 may further include forming a plurality of interface solder structures 113 (ball apply) on the plurality of exposed die pad structures 119. In this way, a direct electrical connection may be formed between the die pads structures 119 first semiconductor die 101 and the plurality of interface solder structures 113.

Figure 9E:
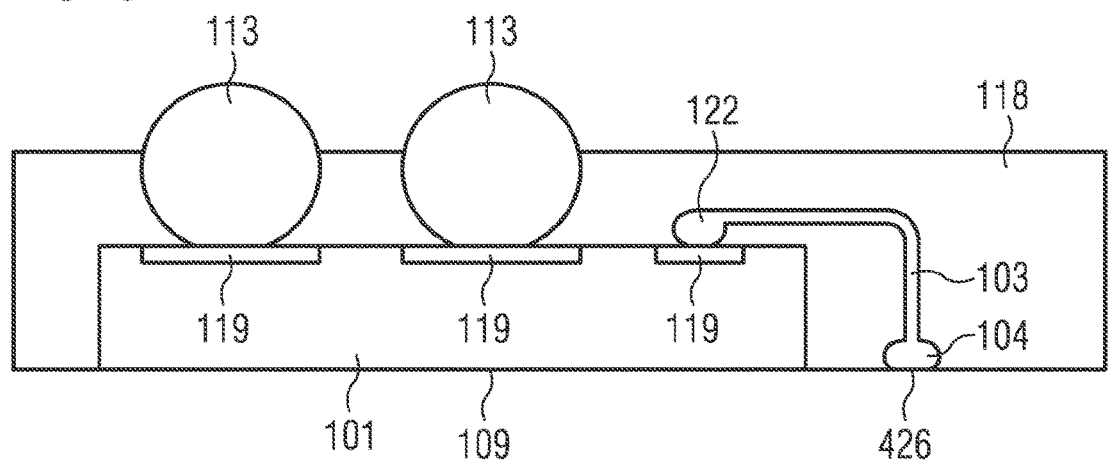

As shown in FIG. 9E, after forming the plurality of interface solder structures 113, the method 900 may include removing the carrier substrate (e.g. by detaping) to expose the surface 426 of the bond interface portion 104 of the wire bond structure 103, and to expose the back side 109 of the first semiconductor die 101. For example, FIG. 9E shows loop wiring 103 with ball apply 113 on pads 119.

Figure 9F:
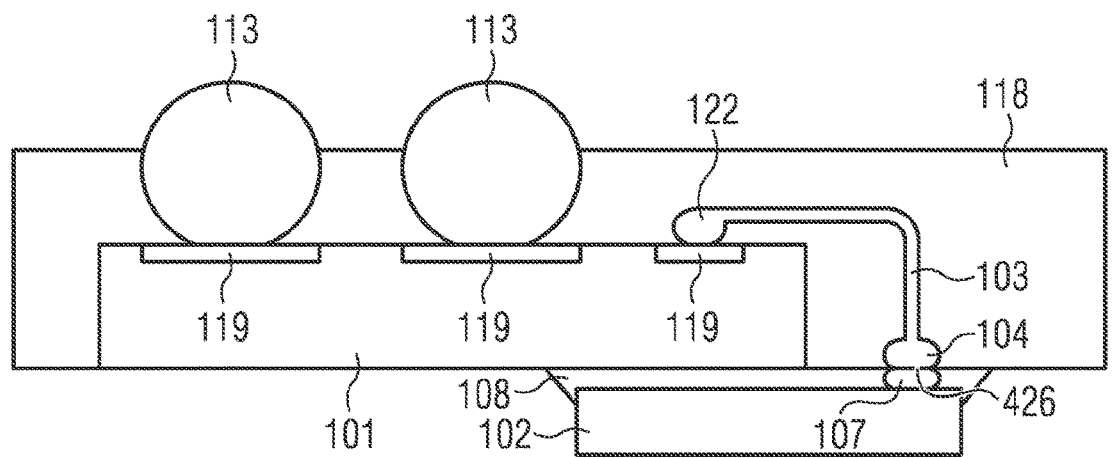

As shown in FIG. 9F, after removing the carrier substrate, the method 900 may include attaching (in a die attach process) a second semiconductor die 102 (e.g. a memory die) so that an interface contact structure 107 of the second semiconductor die 102 is attached to the exposed surface 426 of the bond interface portion 104 of the wire bond structure 103. The method 400 may further include arranging an adhesive underfill material 108 between the first semiconductor die 101 and the second semiconductor die 102.

More details and aspects are mentioned in connection with the examples described above or below. The examples shown in FIGS. 9A to 9F may each comprise one or more optional additional features corresponding to one or more aspects mentioned in connection with the proposed concept or one or more examples described above (e.g. FIGS. 1A to 8) or below (FIGS. 10A to 15).

FIGS. 10A to 10E show schematic illustrations of a method 1000 for forming a semiconductor package. The method 1000 may include one or more or all of the features already described.

Figure 10A:
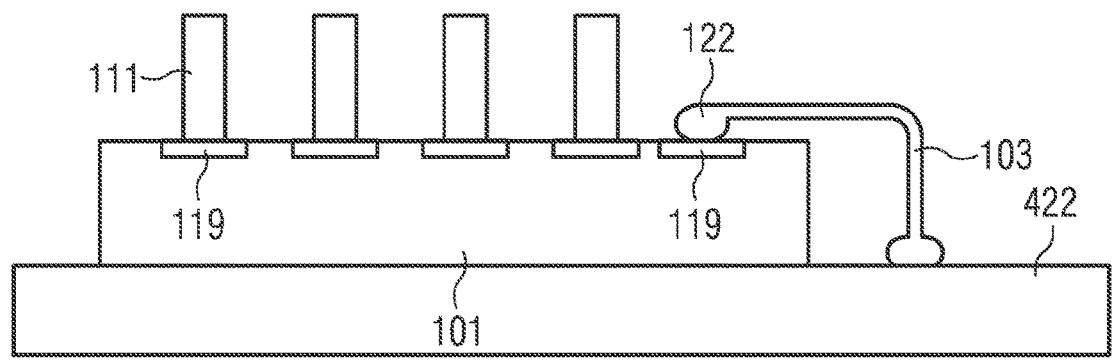
FIGS. 10A to 10E show schematic side view illustrations of a method for forming a semiconductor package with a plurality of interconnect structures arranged at the front side of the semiconductor die.

As shown in FIG. 10A, the method 1000 may include arranging the first semiconductor die 101 on a removable carrier. The first semiconductor die 101 may include a plurality of interconnect structures 111 arranged at the front side 112 of the first semiconductor die 101. For example, FIG. 10A shows a silicon die 101 with Cu studs 111 on pads 119, and a loop wire bond structure 103. Each (or a) interconnect structure 111 may include a die pad portion 119 arranged at the front side 112 of the first semiconductor die 101 and a via portion (e.g. stud portion) arranged on the die pad portion The method 1000 may further include forming a (or e.g. at least one) wire bond structure 103 next to the first semiconductor die 101.

Figure 10B:
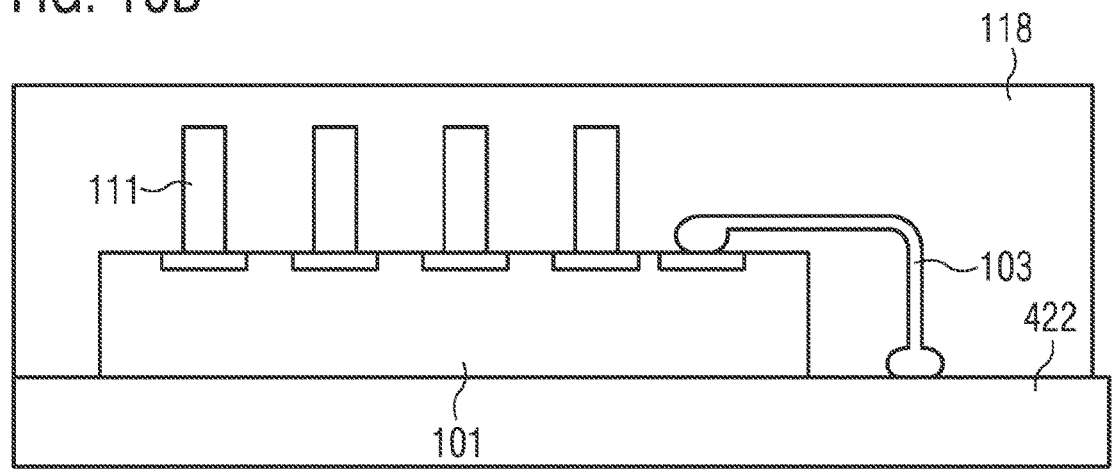

As shown in FIG. 10B, after forming the wire bond structure 103, the method 1000 may further include forming a mold compound structure 118 (molding) around the wire bond structure 103, the first semiconductor die 101 and the plurality of interconnect structures 111, before removing the carrier substrate 422.

Figure 10C:
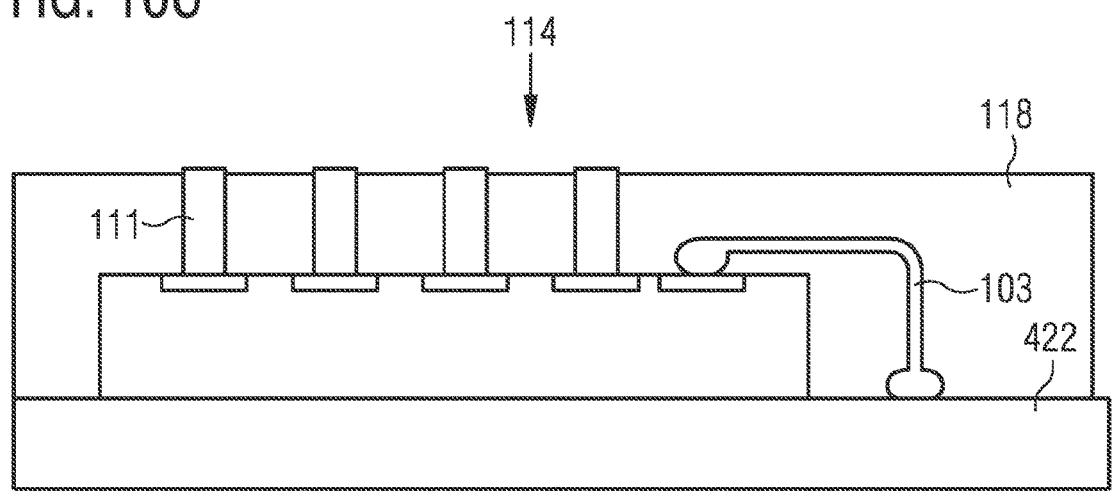

As shown in FIG. 10C, the method 1000 may further include planarizing (e.g. grinding) a surface of the mold compound structure 118 before removing the carrier substrate 422 to expose the plurality of interconnect structures 111 at the first side 114 of the semiconductor package to be formed.

Figure 10D:
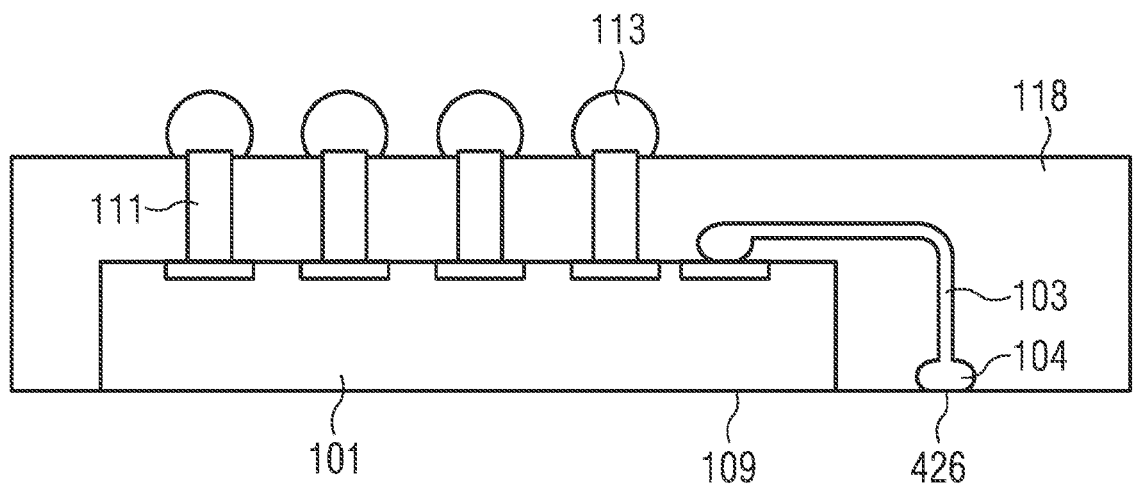

As shown in FIG. 10D, the method 1000 may further include forming a plurality of interface solder structures 113

(in a ball apply process) on the plurality of exposed interconnect structures 111. In this way, a direct electrical connection may be formed between the plurality of exposed interconnect structures 111 and the plurality of interface solder structures 113 (e.g. by a ball apply process on Cu studs). After forming the plurality of interface solder structures 113, the method 1000 may include removing the carrier substrate to expose the surface 426 of the bond interface portion 104 of the wire bond structure 103, and to expose the back side 109 of the first semiconductor die 101.

Figure 10E:
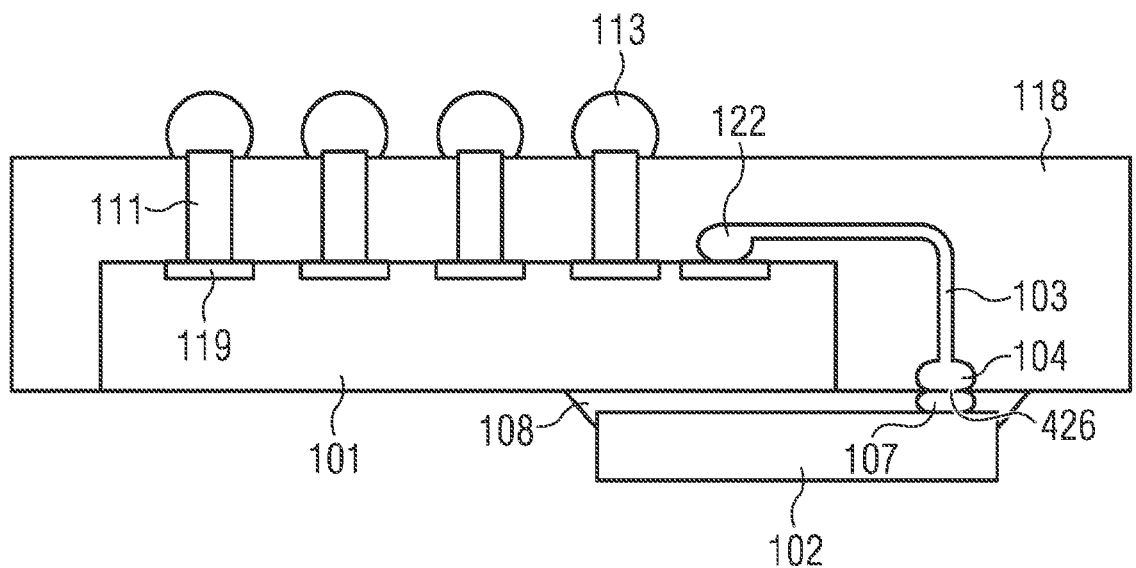

As shown in FIG. 10E, after removing the carrier substrate (e.g. by detaping), the method 1000 may include attaching a second semiconductor die 102 (e.g. in a die attach process) so that an interface contact structure 107 of the second semiconductor die 102 is attached to the exposed surface 426 of the bond interface portion 104 of the wire bond structure 103. The method 400 may further include arranging an adhesive underfill material 108 between the first semiconductor die 101 and the second semiconductor die 102.

More details and aspects are mentioned in connection with the examples described above or below. The examples shown in FIGS. 10A to 10E may each comprise one or more optional additional features corresponding to one or more aspects mentioned in connection with the proposed concept or one or more examples described above (e.g. FIGS. 1A to 9F) or below (FIGS. 11A to 15).

Figure 11A:
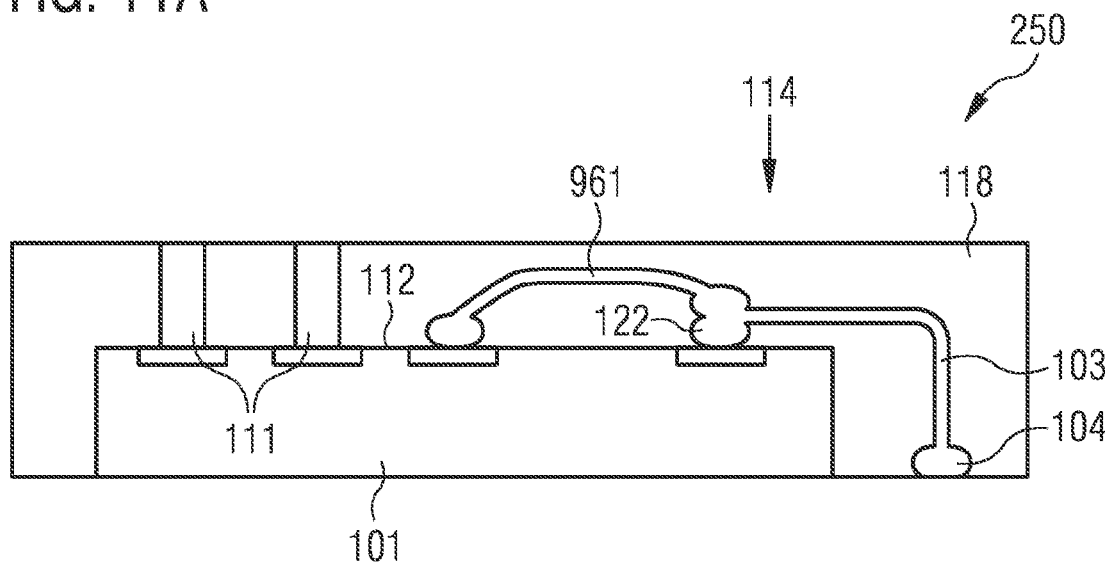
FIGS. 11A to 11B show schematic side view illustrations of a method for forming a semiconductor package with a nail-head on nail-head bond.
Figure 11B:
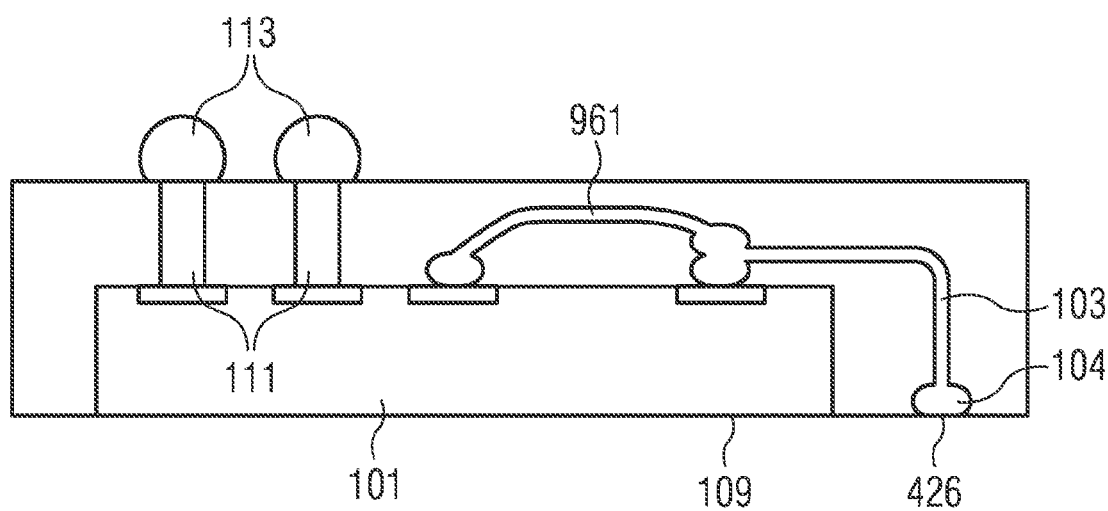

FIGS. 11A and 11B show schematic illustrations of a method 250 for forming a semiconductor package. The method 250 may include one or more or all of the features already described.

As shown in FIG. 11A, the method 250 may include forming a lateral wire bond structure 961 extending from the first die pad structure 119 arranged at the front side 112 of the first semiconductor die 101 to a second die pad structure 119 arranged at the front side 112 of the first semiconductor die 101. The lateral wire bond structure 961 may extend from the second bond interface portion 122 of the wire bond structure 103 to a (e.g. adjacent) second die pad structure 119 arranged at the front side 112 of the first semiconductor die 101. The method 250 may further include planarizing (e.g. grinding) a surface of the mold compound structure 118 to expose the plurality of interconnect structures 111 at the first side 114 of the semiconductor package to be formed. The planarizing process does not expose the wire bond structure 103 since it is a loop wire bond structure 103 which extends towards the die pad structure 119.

As shown in FIG. 11B, the method 250 may further include forming a plurality of interface solder structures 113 (directly) on the plurality of exposed interconnect structures 111, without forming a front side redistribution layer. In this way, a direct electrical connection may be formed between the die pads portions 119 of the first semiconductor die 101 and the plurality of interface solder structures 113. For example, FIG. 11B shows the ball apply process on Cu studs 111 and nail-head on nail-head bonding. The nail-head on nail-head bonding may be used to generate additional connections within a die and/or between a die and a redistribution layer, for example.

Before or after forming the plurality of interface solder structures 113, the method 250 may include removing the carrier substrate to expose the surface 426 of the bond interface portion 104 of the wire bond structure 103, and to expose the back side 109 of the first semiconductor die 101.

More details and aspects are mentioned in connection with the examples described above or below. The examples shown in FIGS. 11A to 11B may each comprise one or more optional additional features corresponding to one or more aspects mentioned in connection with the proposed concept or one or more examples described above (e.g. FIGS. 1A to 10E) or below (FIGS. 12 to 15).

Figure 12:
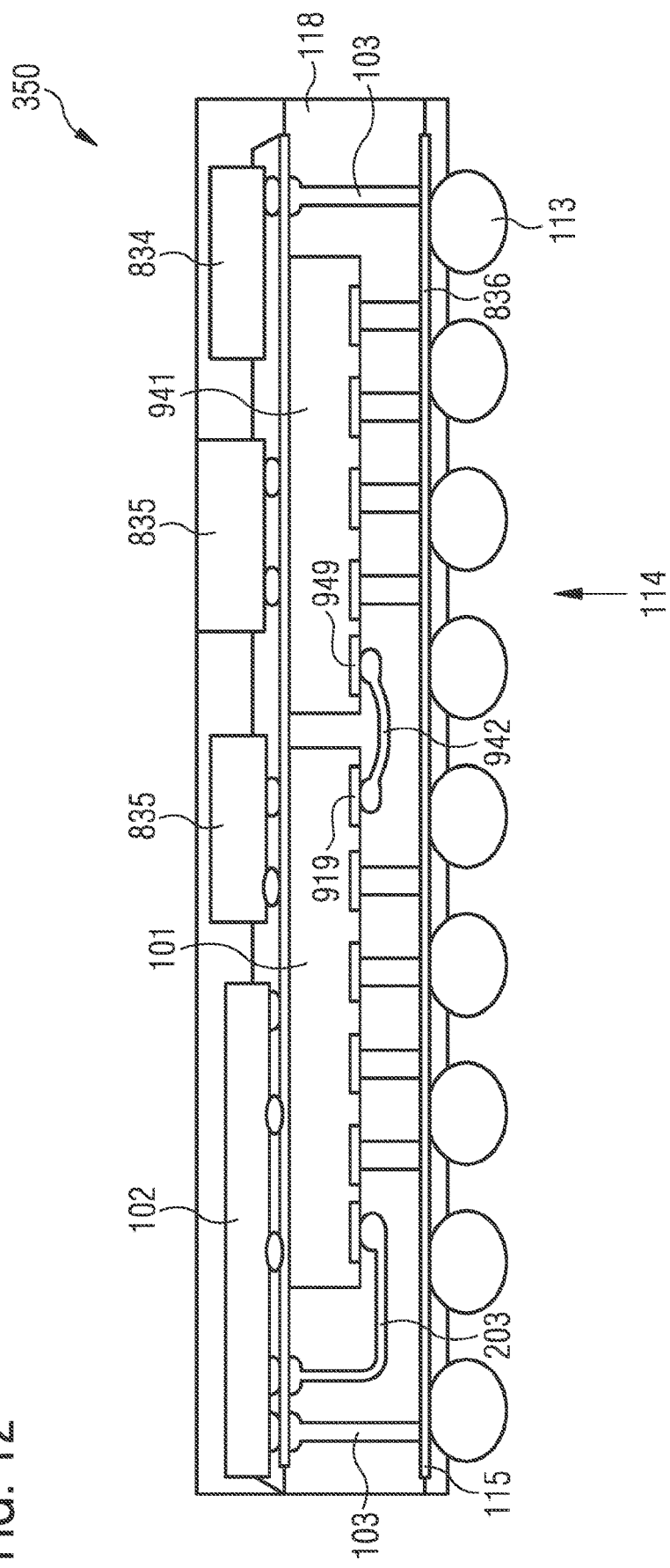
FIG. 12 shows a schematic illustration of a side view of a multi-die semiconductor package.

FIG. 12 shows a schematic illustration of a cross-sectional side view of a semiconductor package 350.

The semiconductor package 350 may include a further semiconductor die 941 arranged laterally adjacent to the first semiconductor die 101. A wire bond interconnect structure 942 may connect a (second) die pad structure 919 of the first semiconductor die 101 to a die pad structure 949 of the further semiconductor die 941. A first end of the wire bond interconnect structure 942 and the die pad structure 919 of the first semiconductor die 101 may be joined via at least one of a nail head bond and a wedge bond. Additionally or optionally, a second end of the wire bond interconnect structure 942 and the die pad structure 949 of the further semiconductor die 941 may be joined via at least one of a nail head bond and a wedge bond. The semiconductor package 350 may include a direct wire bond structure 103, a loop wire bond structure 203, a front (top) side redistribution layer 115, and a back (bottom) side redistribution layer 836. The semiconductor package 350 may be a multi-die system in package with the die to die wire 942, for example. The semiconductor package 350 may further include a second semiconductor die 102, a third semiconductor die 834, a fourth semiconductor die 835, and a fifth semiconductor die 836 attached to the first semiconductor die 101 and/or to the further semiconductor die 941. Optionally, the second semiconductor die 102 may be a transceiver die, the third semiconductor die 834 may be a sensor die, the fourth semiconductor die 835 may be a memory die, and the fifth semiconductor die 836 may be an integrated passive devices die.

More details and aspects are mentioned in connection with the examples described above or below. The examples shown in FIG. 12 may comprise one or more optional additional features corresponding to one or more aspects mentioned in connection with the proposed concept or one or more examples described above (e.g. FIGS. 1A to 11B) or below (FIGS. 13 to 15).

Figure 13:
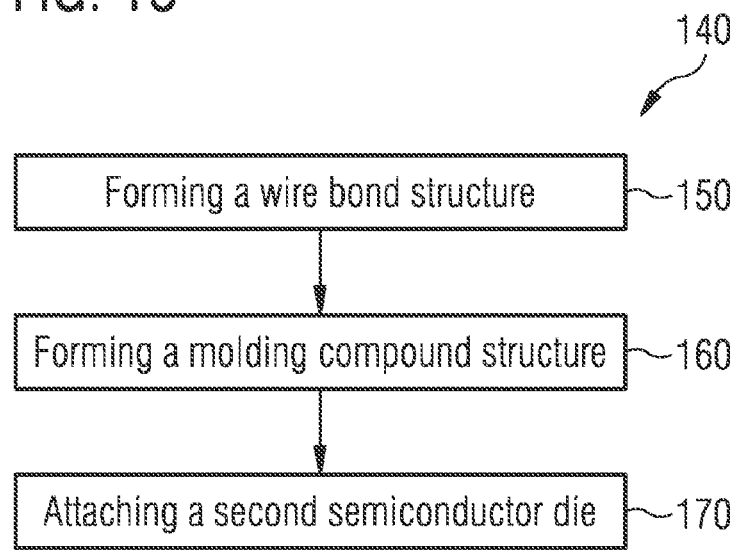
FIG. 13 shows a flow chart of a method for forming a semiconductor package.

FIG. 13 shows a flow chart of a method 140 for forming a semiconductor package. The method 140 comprises forming 150 a wire bond structure next to a first semiconductor die. The method 140 further comprises forming 160 a mold compound structure. The mold compound structure at least partially surrounds the wire bond structure and the first semiconductor die. The method 140 further comprises attaching 170 a second semiconductor die to the first semiconductor die after forming the mold compound structure.

Due to the attaching 170 of the second semiconductor die to the first semiconductor die after forming the mold compound structure, more flexible approaches to die attach processes may be achieved. For example, the wire bond structure is not necessary limited to being formed on a die pad structure, but instead, various connection structures (e.g. solder balls, solder bumps, die pads) of the second semiconductor die may be attached to the first semiconductor die after forming the wire bond structure.

The method 140 may include forming the mold compound structure, so that the mold compound structure may surround the wire bond structure and the first semiconductor die. For example, the mold compound structure may encapsulate the first semiconductor die and the wire bond structure 103 except at the back side of the first semiconductor die. Additionally, other than the surface of the bond interface portion for attaching to the interface contact structure of the second semiconductor die, the rest of the wire bond structure may be surrounded by the mold compound structure.

The method 140 may include attaching the second semiconductor die so that the second semiconductor die is arranged at a back side of the first semiconductor die. The first semiconductor die and the bond interface portion of the wire bond structure may be arranged at the same side of the second semiconductor die. Attaching the second semiconductor die may include soldering a contact structure of the second semiconductor die to a bond interface portion of the wire bond structure. The method 140 may include forming an over-mold compound structure around the second semiconductor die after attaching the second semiconductor die.

More details and aspects are mentioned in connection with the examples described above or below. The examples shown in FIG. 13 may comprise one or more optional additional features corresponding to one or more aspects mentioned in connection with the proposed concept or one or more examples described above (e.g. FIGS. 1A to 12) or below (FIGS. 14A to 15).

Figure 14A:
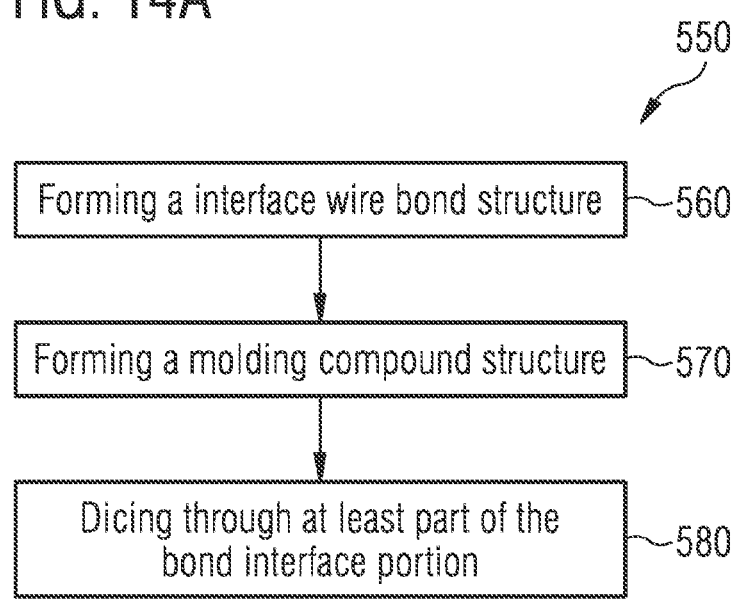
FIG. 14A shows a flow chart of a method for forming a further semiconductor package including forming a side surface of a bond interface portion.
Figure 15:
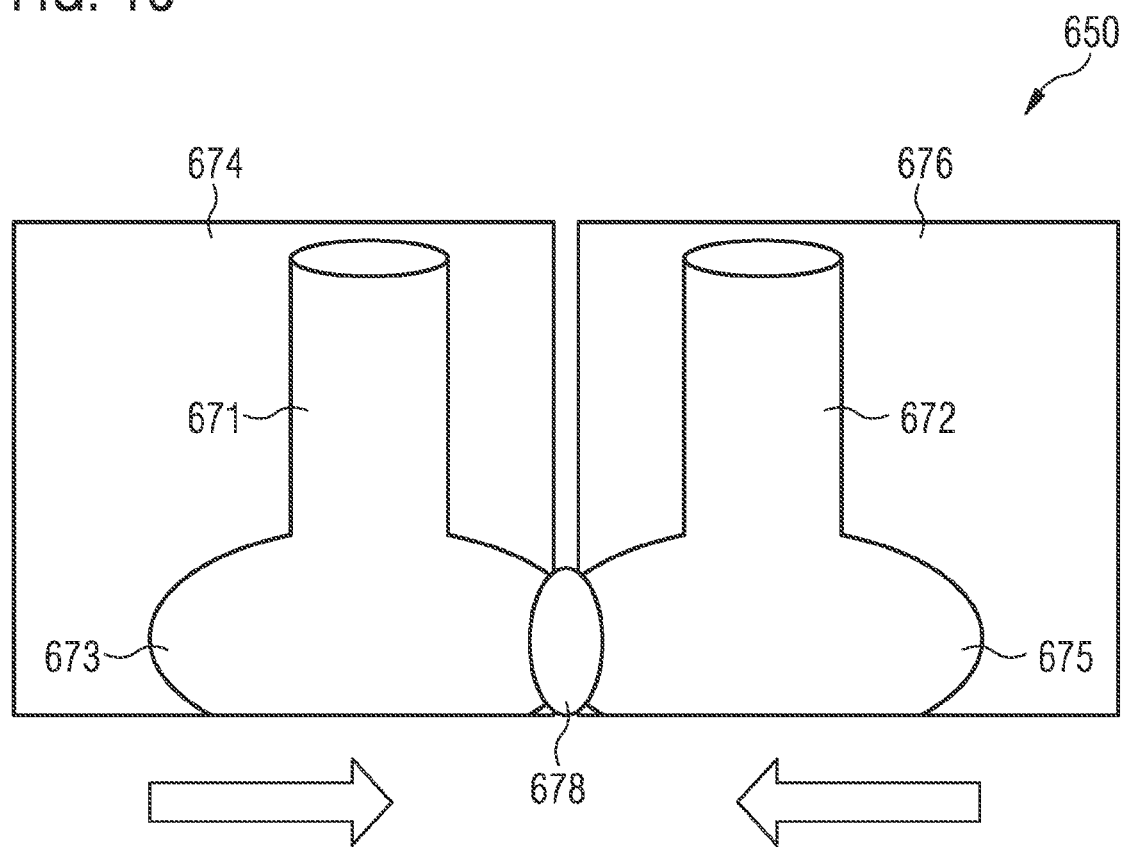
FIG. 15 shows a schematic illustration of a semiconductor package with a bond interface portion soldered to a further bond interface portion.

FIG. 14A shows a flow chart of a method 550 for forming a semiconductor package. The method 550 may include forming 560 an interface wire bond structure next to a semiconductor die. The wire bond structure comprises a bond interface portion. The method 550 may further include forming 570 a mold compound structure. The mold compound structure at least partially surrounds the interface wire bond structure and the semiconductor die. The method 550 may further include dicing 580 through at least part of the bond interface portion of the interface wire bond structure to form a side surface of the bond interface portion.

Due to the dicing 580 through of at least part of the bond interface portion of the interface wire bond structure to form a side surface of the bond interface portion, a semiconductor package with a higher number of connections and more connection options may be achieved. For example, laterally adjacent semiconductor dies may be more easily connected using the side surfaces of the bond interface portions.

The bond interface portion of the interface wire bond structure and the bond interface portion of the second interface wire bond structure may be arranged between the semiconductor die of a first semiconductor die arrangement and a semiconductor die of a second semiconductor die arrangement.

The bond interface portion of the interface wire bond structure may include or may be a nail-head structure. The method may further include soldering the side surface of the bond interface portion of the interface wire bond structure to a side surface of a bond interface portion of a second interface wire bond structure. In this way a connection (e.g. a nail-head to solder to nail-head connection may be formed).

Figure 14B:
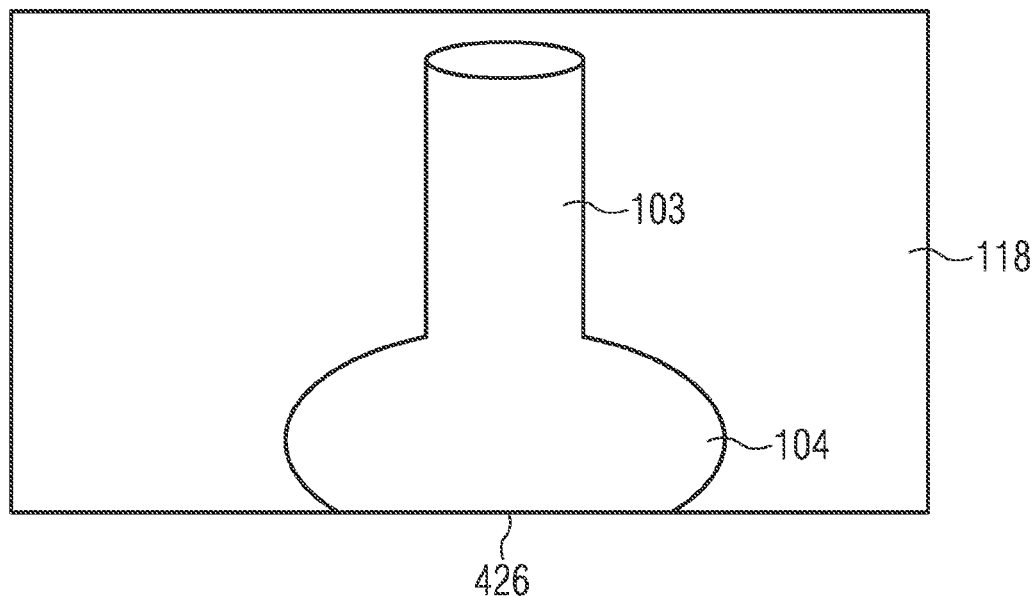
FIGS. 14B to 14C show schematic side view illustrations of the method for forming the further semiconductor package.

FIG. 14B shows an exposed lateral surface 426 of the bond interface portion 104 of the wire bond structure 103 after removing the removable carrier substrate. The bond interface portion 104 may be generated and molded. For example, FIG. 14B shows a nail head 104 (e.g. an Au nail head) after molding (e.g. encapsulating) by a molding compound structure 118.

Figure 14C:
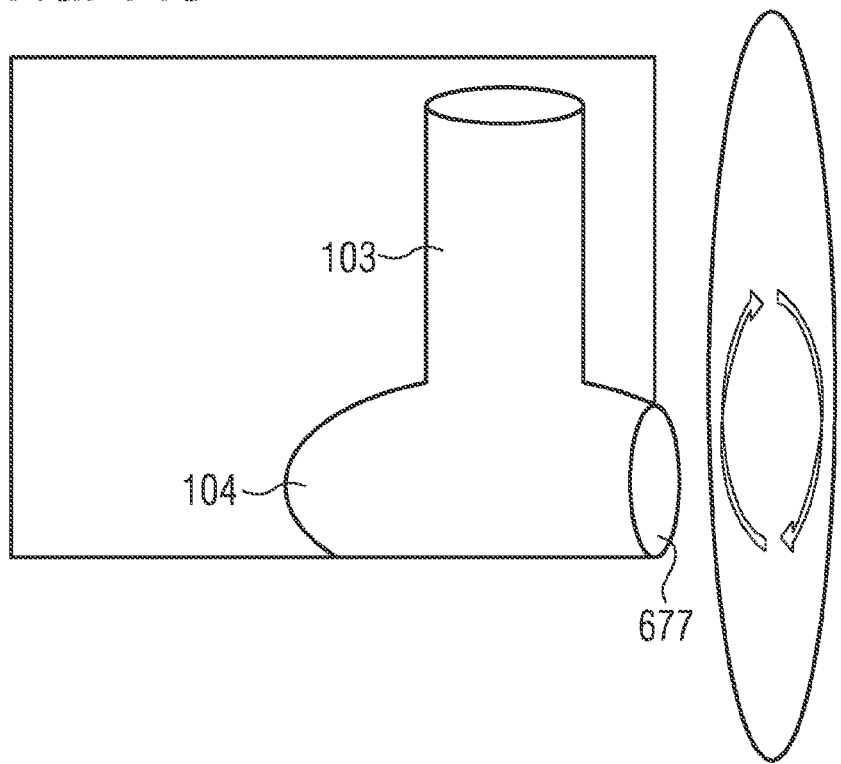

FIG. 14C shows the cut nail head after the dicing (e.g. sawing) through of at least part of the bond interface portion 104 (e.g. the Au nail head) to form a side surface 677 (e.g. a solder area). The dicing process may include dicing through both the mold compound structure 118 and the bond interface portion 104 of the interface wire bond structure 103.

More details and aspects are mentioned in connection with the examples described above or below. The examples shown in FIGS. 14A to 14C may each comprise one or more optional additional features corresponding to one or more aspects mentioned in connection with the proposed concept or one or more examples described above (e.g. FIGS. 1A to 13) or below (FIG. 15).

FIG. 15 shows a schematic illustration of a cross-sectional side view of a semiconductor package 650.

The semiconductor package 650 comprises a first interface wire bond structure 671 comprising a bond interface portion 673. At least part of the first interface wire bond structure 671 is surrounded by a first mold compound structure 674. The semiconductor package 650 further comprises a second interface wire bond structure 672 comprising a bond interface portion 675. At least part of the second interface wire bond structure 672 is surrounded by a second mold compound structure 676. The bond interface portion 673 of the first interface wire bond structure 671 is soldered 678 to the bond interface portion 675 of the second interface wire bond structure 672.

Due to the bond interface portion 673 of the first interface wire bond structure 671 being soldered 678 to the bond interface portion 675 of the second interface wire bond structure 672, a semiconductor package with a higher number of connections and more connection options may be achieved.

The semiconductor package 650 may be formed by assembling two semiconductor devices (e.g. packages) via soldering. For example, two semiconductor devices (e.g. packages) may be connected via cut nail heads 673, 675 and a solder structure 678. The first interface wire bond structure 671 may be arranged next to (e.g. laterally adjacent to) a semiconductor die of a first semiconductor device. For example, the first interface wire bond structure 671 may be arranged adjacent to a vertical edge of the semiconductor die of the first semiconductor device. The first mold compound structure 674 of the first semiconductor device may surround (may be formed around) the first interface wire bond structure 671 and the semiconductor die of the first semiconductor device. The second interface wire bond structure 672 may be arranged next to a semiconductor die of a second semiconductor arrangement. For example, the second interface wire bond structure 672 may be arranged adjacent to a vertical edge of the semiconductor die of the second semiconductor device. The second mold compound structure 676 of the second semiconductor device may surround (may be formed around) the second interface wire bond structure 672 and the semiconductor die of the second semiconductor device. Thus, the bond interface portion 673 of the first interface wire bond structure 671 and the bond interface portion 675 of the second interface wire bond structure 672 may be arranged laterally between the semiconductor die of the first semiconductor device and the semiconductor die of the second semiconductor device.

The bond interface portion 673 of the first interface wire bond structure 671 and the bond interface portion 675 of the second interface wire bond structure 672 may be nail-head structures. The bond interface portion 673 of the first interface wire bond structure 671 may be soldered to the bond interface portion 675 of the second interface wire bond structure 672 via a solder structure 678 of the semiconductor package 650. The solder structure 678 may be arranged laterally between the bond interface portion 673 of the first interface wire bond structure 671 and the bond interface portion 675 of the second interface wire bond structure 672. The solder structure 678 may join a side surface of the bond interface portion 673 of the first interface wire bond structure 671 to a side surface of the bond interface portion 675 of the second interface wire bond structure 672. Optionally, the side surfaces of the bond interface portion 673, 675 may be (but are not limited to being) vertical surfaces.

More details and aspects are mentioned in connection with the examples described above or below. The examples shown in FIG. 15 may comprise one or more optional additional features corresponding to one or more aspects mentioned in connection with the proposed concept or one or more examples described above (e.g. FIGS. 1A to 14C) or below.

There may be a demand to provide concepts for a semiconductor package with a higher number of vertical connections and more connection options.

The various examples described herein may relate to die stacking including wire bond nail heads, for example.

The aspects and features (e.g. the first semiconductor die, the second semiconductor die, the one or more wire bond structures, the bond interface portion, the nail-head structure, the mold compound structure, the plurality of interconnect structures, the plurality of die pad structures, the plurality of interface solder structures, the side surfaces, the first semiconductor device, the second semiconductor device) mentioned and described together with one or more of the previously detailed examples and figures, may as well be combined with one or more of the other examples in order to replace a like feature of the other example or in order to additionally introduce the feature to the other example.

In the following, examples pertain to further examples.

Example 1 is a semiconductor package, comprising: a first semiconductor die; a semiconductor device comprising a second semiconductor die, and one or more wire bond structures, wherein the wire bond structure comprises a bond interface portion, wherein the wire bond structure is arranged next to the first semiconductor die, wherein the first semiconductor die and the bond interface portion of the wire bond structure are arranged at the same side of the semiconductor device, and wherein an interface contact structure of the semiconductor device is electrically connected to the wire bond structure.

In example 2, the subject matter of example 1 can optionally include the bond interface portion of the wire bond structure comprising a nail-head structure or a ball structure.

In example 3, the subject matter of example 1 or 2 can optionally include the interface contact structure of the semiconductor device comprising a solder structure.

In example 4, the subject matter of any of examples 1 to 3 can optionally include the interface contact structure of the semiconductor device being soldered to the bond interface portion of the wire bond structure.

In example 5, the subject matter of any of examples 1 to 4 can optionally include the interface contact structure of the semiconductor device being arranged at a level of a back side of the first semiconductor die.

In example 6, the subject matter of any of examples 1 to 5 can optionally further include a mold compound structure surrounding at least the wire bond structure and the first semiconductor die.

In example 7, the subject matter of any of examples 1 to 6 can optionally further include at least one back side redistribution layer arranged at a back side of the first semiconductor die, wherein the interface contact structure of the semiconductor device is electrically connected to the bond interface portion of the wire bond structure via the at least one back side redistribution layer.

In example 8, the subject matter of any of examples 1 to 7 can optionally further include at least one wire bond structure of the one or more wire bond structures extending from the interface contact structure of the semiconductor device to a die pad structure arranged at a front side of the first semiconductor die.

In example 9, the subject matter of example 8 can optionally further include the at least one wire bond structure further comprising a second bond interface portion attached to the die pad structure.

In example 10, the subject matter of example 9 can optionally further include the second bond interface portion of the wire bond structure comprising a nail-head structure or a wedge structure.

In example 11, the subject matter of any of examples 1 to 10 can optionally include at least one wire bond structure of the one or more wire bond structures extending from the interface contact structure of the semiconductor device to a front side redistribution layer arranged at a front side of the first semiconductor die.

In example 12, the subject matter of example 11 can optionally include the at least one wire bond structure comprising: a first bond interface portion electrically connected to the interface contact structure of the semiconductor device; a second bond interface portion attached to a die pad structure arranged at a front side of the first semiconductor die; and a third bond interface portion attached to the second bond interface portion of the wire bond structure.

In example 13, the subject matter of example 12 can optionally include the second bond interface portion of the at least one wire bond structure being soldered to the third bond interface portion of the at least one wire bond structure.

In example 14, the subject matter of example 12 or 13 can optionally include the second bond interface portion of the at least one wire bond structure and the third bond interface portion of the at least one wire bond structure being joined via a nail-head on nail-head bond.

In example 15, the subject matter of any of examples 1 to 14 can optionally include a first wire bond structure of the one or more wire bond structures extending from the interface contact structure of the semiconductor device and ending at a front side redistribution layer arranged at a front side of the first semiconductor die; and a second wire bond structure extending from the interface contact structure of the semiconductor device and ending at a die pad structure arranged at a front side of the first semiconductor die.

In example 16, the subject matter of any of examples 1 to 15 can optionally include a first wire bond structure of the one or more wire bond structures extending from the interface contact structure of the semiconductor device to a front side redistribution layer arranged at a front side of the first semiconductor die; and a second wire bond structure extending from the interface contact structure of the semiconductor device to a front side redistribution layer arranged at a front side of the first semiconductor die via a die pad structure arranged at a front side of the first semiconductor die.

In example 17, the subject matter of any of examples 9 to 16 can optionally further include a lateral wire bond structure extending from the second bond interface portion of the at least one wire bond structure to a second die pad structure arranged at the front side of the first semiconductor die.

In example 18, the subject matter of example 17 can optionally include the second bond interface portion of the at least one wire bond structure being soldered to a bond interface portion of the lateral wire bond structure.

In example 19, the subject matter of example 17 or 18 can optionally include the at least one wire bond structure and the lateral wire bond structure being joined via a nail-head on nail-head bond.

In example 20, the subject matter of any of examples 1 to 19 can optionally further include a plurality of interconnect structures extending from a front side of the first semiconductor die towards a plurality of interface solder structures arranged at a first side of the semiconductor package.

In example 21, the subject matter of example 20 can optionally include the plurality of interface solder structures being configured to provide a flip-chip connection to a carrier structure.

In example 22, the subject matter of example 21 can optionally include the carrier structure comprising an interposer carrier structure or a printed circuit board.

In example 23, the subject matter of any of examples 1 to 22 can optionally include the first semiconductor die comprising at least one circuit selected from the following group of circuits: a logic circuit, a transistor circuit, a processor circuit.

In example 24, the subject matter of any of examples 1 to 23 can optionally include the semiconductor device comprising the second semiconductor die comprising a flip chip semiconductor package.

In example 25, the subject matter of any of examples 1 to 23 can optionally include the semiconductor device comprising the second semiconductor die comprising a bare die semiconductor device.

In example 26, the subject matter of any of examples 1 to 25 can optionally include an adhesive underfill material arranged between the first semiconductor die and the semiconductor device.

In example 27, the subject matter of example 26 can optionally include at least part of the underfill material arranged between interface contact structures of a plurality of interface contact structures arranged at a front side of the semiconductor device.

In example 28, the subject matter of any of examples 1 to 27 can optionally include the second semiconductor die comprising at least one circuit selected from the following group of circuits: a memory circuit, an antenna circuit, a sensor circuit, an integrated passive components circuit and a transceiver circuit, a logic circuit, a transistor circuit.

In example 29, the subject matter of any of examples 1 to 28 can optionally further include a further semiconductor die arranged laterally adjacent to the first semiconductor die, wherein a wire bond interconnect structure connects a die pad structure of the first semiconductor die to a die pad structure of the further semiconductor die.

In example 30, the subject matter of example 29 can optionally include the wire bond interconnect structure and the die pad structure of the first semiconductor die being joined via a wedge bond, and wherein the wire bond interconnect structure and the die pad structure of the further semiconductor die are joined via a wedge bond.

Example 31 is a semiconductor package, comprising: a first interface wire bond structure comprising a bond interface portion, wherein at least part of the first interface wire bond structure is surrounded by a first mold compound structure; and a second interface wire bond structure comprising a bond interface portion, wherein at least part of the second interface wire bond structure is surrounded by a second mold compound structure; and wherein the bond interface portion of the first interface wire bond structure is soldered to the bond interface portion of the second interface wire bond structure.

In example 32, the subject matter of example 31 can optionally include the first interface wire bond structure being arranged next to a semiconductor die of a first semiconductor device; and, the second interface wire bond structure being arranged next to a semiconductor die of a second semiconductor device.

In example 33, the subject matter of example 31 or 32 can optionally include the bond interface portion of the first interface wire bond structure and the bond interface portion of the second interface wire bond structure are arranged between the semiconductor die of the first semiconductor device and the semiconductor die of the second semiconductor device.

In example 34, the subject matter of any of examples 31 to 33 can optionally further include a solder structure arranged between the bond interface portion of the first interface wire bond structure and the bond interface portion of the second interface wire bond structure.

In example 35, the subject matter of example 34 can optionally include the solder structure joining a side surface of the bond interface portion of the first interface wire bond structure to a side surface of the bond interface portion of the second interface wire bond structure.

In example 36, the subject matter of any of examples 31 to 35 can optionally include the bond interface portion of the first interface wire bond structure and the bond interface portion of the second interface wire bond structure being nail-head structures.

Example 37 is a method for forming a semiconductor package, the method comprising: forming one or more wire bond structures next to a first semiconductor die, wherein the wire bond structure comprises a bond interface portion formed on a removable carrier substrate; removing the carrier substrate to expose a surface of the bond interface portion of the wire bond structure; and attaching a semiconductor device comprising a second semiconductor die so that an interface contact structure of the semiconductor device is attached to the exposed surface of the bond interface portion of the wire bond structure.

In example 38, the subject matter of example 37 can optionally include that forming the wire bond structure further comprises forming a wire portion of the wire bond structure, wherein the wire portion extends from the bond interface portion of the wire bond structure.

In example 39, the subject matter of example 38 can optionally include that forming the wire bond structure comprises terminating the wire portion of the wire bond structure at a first side of the semiconductor package.

In example 40, the subject matter of example 38 can optionally include that forming the wire bond structure further comprises forming a second bond interface portion on a die pad structure of the first semiconductor die.

In example 41, the subject matter of example 40 can optionally include that the second bond interface portion of the wire bond structure comprises a nail head structure or a wedge structure.

In example 42, the subject matter of example 40 or 41 can optionally include that forming the wire bond structure further comprises forming a third bond interface portion attached to the second bond interface portion of the wire bond structure.

In example 43, the subject matter of any of examples 40 to 42 can optionally include the second bond interface portion of the wire bond structure and the third bond interface portion of the wire bond structure being connected via a nail-head on nail-head bond.

In example 44, the subject matter of any of examples 37 to 43 can optionally include that forming the one or more wire bond structures comprises forming a bond interface portion of a first wire bond structure on the removable carrier substrate, wherein the first wire bond structure extends towards a first side of the semiconductor package; and forming a bond interface portion of a second wire bond structure on the removable carrier substrate, wherein the second wire bond structure extends to a die pad structure of the first semiconductor die.

In example 45, the subject matter of any of examples 37 to 44 can optionally include that forming the one or more wire bond structures comprises forming a bond interface portion of a first wire bond structure on the removable carrier substrate, wherein the first wire bond structure extends towards a first side of the semiconductor package; and forming a bond interface portion of a second wire bond structure on the removable carrier substrate, wherein the second wire bond structure extends towards the first side of the semiconductor package via a die pad structure arranged at a front side of the first semiconductor die.

In example 46, the subject matter of any of examples 37 to 45 can optionally include that the bond interface portion of the wire bond structure is formed by a thermal compression process.

In example 47, the subject matter of any of examples 37 to 46 can optionally include that the removable carrier substrate comprises an adhesive sheet, a die-attach foil, a multi-layer foil, or a plate.

In example 48, the subject matter of any of examples 37 to 47 can optionally include the carrier substrate being removed by at least one process selected from the following group of processes: a peeling process, a shearing process, a dissolving process, a grinding process, and a radiation process.

In example 49, the subject matter of any of examples 37 to 48 can optionally further include forming a mold compound structure around the wire bond structure and the first semiconductor die before removing the carrier substrate.

In example 50, the subject matter of example 49 can optionally further include planarizing a surface of the mold compound structure before removing the carrier substrate to expose a plurality of interconnect structures electrically connected to the first semiconductor die.

In example 51, the subject matter of example 50 can optionally further include forming a plurality of interface solder structures at a first side of the semiconductor package before attaching the semiconductor device, wherein the solder structures of the plurality of interface solder structures are electrically connected to the interconnect structures of the plurality of interconnect structures.

In example 52, the subject matter of any of examples 37 to 51 can optionally further include forming at least one front side redistribution layer at a front side of the first semiconductor die before attaching the semiconductor device.

In example 53, the subject matter of example 52 can optionally include the solder structures of the plurality of interface solder structures being electrically connected to the interconnect structures of the plurality of interconnect structures via the at least one front side redistribution layer.

In example 54, the subject matter of any of examples 37 to 53 can optionally include attaching the semiconductor device so that the semiconductor device is arranged at a back side of the first semiconductor die.

In example 55, the subject matter of any of examples 37 to 54 can optionally include attaching the semiconductor device so that the first semiconductor die and the bond interface portion of the wire bond structure are arranged at the same side of the semiconductor device.

56. The method according to any of claims 37 to 55, wherein attaching the semiconductor device comprises soldering the contact structure of the semiconductor device to the bond interface portion of the wire bond structure.

57. The method according to any of claims 37 to 55, further comprising forming a back side redistribution layer at a back side of the first semiconductor die, and attaching the semiconductor device so that the contact structure of the semiconductor device is attached to the exposed surface of the bond interface portion of the wire bond structure via the back side redistribution layer.

Example 58 is a method for forming a semiconductor package, the method comprising: forming a wire bond structure next to a first semiconductor die; forming a mold compound structure, wherein the mold compound structure at least partially surrounds the wire bond structure and the first semiconductor die; attaching a second semiconductor die to the first semiconductor die after forming the mold compound structure.

In example 59, the subject matter of example 58 can optionally further include forming an over-mold compound structure around the second semiconductor die after attaching the second semiconductor die.

In example 60, the subject matter of example 58 or 59 can optionally attaching the second semiconductor die so that the second semiconductor die is arranged at a back side of the first semiconductor die.

In example 61, the subject matter of any of examples 58 to 60 can optionally include attaching the second semiconductor die so that the first semiconductor die and the bond interface portion of the wire bond structure are arranged at the same side of the second semiconductor die.

In example 62, the subject matter of any of examples 58 to 61 can optionally include that attaching the second semiconductor die comprises soldering a contact structure of the second semiconductor die to a bond interface portion of the wire bond structure.

Example 63 is a method for forming a semiconductor die package, the method comprising: forming an interface wire bond structure next to a semiconductor die, wherein the wire bond structure comprises a bond interface portion; forming a mold compound structure, wherein the mold compound structure at least partially surrounds the interface wire bond structure and the semiconductor die; and dicing through at least part of the bond interface portion of the interface wire bond structure to form a side surface of the bond interface portion.

In example 64, the subject matter of example 63 can optionally include the bond interface portion of the interface wire bond structure comprising a nail-head structure.

In example 65, the subject matter of example 63 or 64 can optionally further include soldering the side surface of the bond interface portion of the interface wire bond structure to a side surface of a bond interface portion of a second interface wire bond structure.

In example 66, the subject matter of example 65 can optionally include the bond interface portion of the interface wire bond structure and the bond interface portion of the second interface wire bond structure being arranged between the semiconductor die of a first semiconductor device and a semiconductor die of a second semiconductor device.

Example 67 is a machine readable storage medium including program code, which when executed, causes a machine to perform the method of any of examples 37 to 66.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor package, comprising:
    a first semiconductor die;
    a semiconductor device comprising a second semiconductor die, and
    one or more wire bond structures, wherein a wire bond structure of the one or more wire bond structures comprises a first and a second bond interface portion and wherein the first and second bond interface portions of the wire bond structure comprise a nail-head structure or a ball structure,
        wherein the wire bond structure is arranged next to the first semiconductor die,
        wherein the first semiconductor die and the first bond interface portion of the wire bond structure are arranged at the same side of the semiconductor device,
        wherein the second bond interface portion of the wire bond structure is electrically connected to the first semiconductor die,
        wherein an interface contact structure of the semiconductor device is electrically connected to the first bond interface portion of the wire bond structure, and
        wherein the first bond interface portion directly contacts the interface contact structure.

2. The semiconductor package according to claim 1, wherein the interface contact structure of the semiconductor device comprises a solder structure.

3. The semiconductor package according to claim 1, wherein the interface contact structure of the semiconductor device is directly soldered to the first bond interface portion of the wire bond structure.

4. The semiconductor package according to claim 1, wherein the interface contact structure of the semiconductor device is arranged at a level of a back side of the first semiconductor die.

5. The semiconductor package according to claim 1, further comprising a mold compound structure surrounding at least the wire bond structure and the first semiconductor die.

6. The semiconductor package according to claim 1, further comprising at least one back side redistribution layer arranged at a back side of the first semiconductor die,
    wherein the interface contact structure of the semiconductor device is electrically connected to the first bond interface portion of the wire bond structure via the at least one back side redistribution layer.

7. The semiconductor package according to claim 1, wherein the second bond interface portion of the wire bond structure is attached to a die pad structure arranged at a front side of the first semiconductor die.

8. The semiconductor package according to claim 1, further comprising a plurality of interconnect structures extending from a front side of the first semiconductor die towards a plurality of interface solder structures arranged at a first side of the semiconductor package.

9. The semiconductor package according to claim 1, wherein the first semiconductor die comprises at least one circuit selected from the following group of circuits: a logic circuit, a transistor circuit, a processor circuit.

10. The semiconductor package according to claim 1, wherein the semiconductor device comprising the second semiconductor die comprises a flip chip semiconductor package.

11. The semiconductor package according to claim 1, wherein the semiconductor device comprising the second semiconductor die comprises a bare die semiconductor device.

12. The semiconductor package according to claim 1, wherein the second semiconductor die comprises at least one circuit selected from the following group of circuits: a memory circuit, an antenna circuit, a sensor circuit, an integrated passive components circuit and a transceiver circuit, a logic circuit, a transistor circuit.

13. A method for forming a semiconductor package, the method comprising:
    forming a wire bond structure next to a first semiconductor die;
    wherein the wire bond structure comprises a first and a second bond interface portion and wherein the first and the second bond interface portions comprise a nail-head structure or a ball structure;
    attaching the second bond interface portion of the wire bond structure to a die pad structure of the first semiconductor die;

forming a mold compound structure, wherein the mold compound structure at least partially surrounds the wire bond structure and the first semiconductor die,
wherein a surface of the wire bond structure is located at a corresponding level of a back surface of the first semiconductor die and wherein the surface of the wire bond structure is not surrounded by the mold compound structure; and
attaching a second semiconductor die to the first semiconductor die after forming the mold compound structure by soldering an interface contact structure of the second semiconductor die to the first bond interface portion of the wire bond structure.

14. The method according to claim 13, further comprising forming an over-mold compound structure around the second semiconductor die after attaching the second semiconductor die.

* * * * *